(12) United States Patent
Wang et al.

(10) Patent No.: US 12,556,179 B2
(45) Date of Patent: Feb. 17, 2026

(54) MIXED-SIGNAL OPERATIONAL CIRCUIT

(71) Applicant: HUAZHONG UNIVERSITY OF SCIENCE AND TECHNOLOGY, Hubei (CN)

(72) Inventors: Chao Wang, Hubei (CN); Wenming Zhu, Hubei (CN); Ziyuan Wen, Hubei (CN); Guoyi Yu, Hubei (CN); Yuansheng Zhao, Hubei (CN)

(73) Assignee: HUAZHONG UNIVERSITY OF SCIENCE AND TECHNOLOGY, Hubei (CN)

( * ) Notice: Subject to any disclaimer, the term of this patent is extended or adjusted under 35 U.S.C. 154(b) by 4 days.

(21) Appl. No.: 18/655,329

(22) Filed: May 6, 2024

(65) Prior Publication Data

US 2025/0240018 A1 Jul. 24, 2025

(30) Foreign Application Priority Data

Jan. 24, 2024 (CN) .......................... 202410098510.0

(51) Int. Cl.
*H03K 19/00* (2006.01)
*H03K 17/687* (2006.01)
*H03K 19/20* (2006.01)

(52) U.S. Cl.
CPC ......... *H03K 17/6871* (2013.01); *H03K 19/20* (2013.01)

(58) Field of Classification Search
CPC ...... H03K 19/20; H03K 19/21; H03K 19/215; H03K 19/0008; H03K 19/0013; H03K 19/0016; H03L 19/0019
See application file for complete search history.

(56) References Cited

U.S. PATENT DOCUMENTS 7,095,252 B2 * 8/2006 Haase ................ H03K 19/0963 326/97
2017/0005659 A1 * 1/2017 Tamura .............. H03K 19/0013

\* cited by examiner

*Primary Examiner* — Tuan T Lam
(74) *Attorney, Agent, or Firm* — JCIPRNET

(57) ABSTRACT

A mixed-signal operational circuit is provided. For the operational circuit part of the mixed-signal operational circuit, a first capacitor is used to determine the output terminal of the logic operational circuit, a second capacitor is used to provide a certain voltage, and a logic operational channel selects the charge channel from the second capacitor to the first capacitor based on the data signal of each input, so as to superimpose the voltage value at the output terminal. Time-division multiplexing is achieved through successive injection, thereby an analog voltage value related to the logical operation result is established at the output terminal.

5 Claims, 7 Drawing Sheets

MIXED-SIGNAL OPERATIONAL CIRCUIT

CROSS-REFERENCE TO RELATED APPLICATION

This application claims the priority benefit of China application serial no. 202410098510.0, filed on Jan. 24, 2024. The entirety of the above-mentioned patent application is hereby incorporated by reference herein and made a part of this specification.

BACKGROUND

Technical Field

The disclosure belongs to the technical field of integrated circuits, and particularly relates to a mixed-signal operational circuit.

Description of Related Art

In edge computing application scenarios such as face detection, wearable/implanted health detection, smart sensors, and smart Internet of Things, resources at the mobile device terminal are limited, and the high energy consumption problem of conventional embedded graphics processing units (GPUs) and deep neural network hardware accelerators based on digital domain operations is prominent. The mixed-signal operational circuit is a new computing structure suitable for high-energy-efficiency deep neural network computing, in which the structure processes the core complex operations of the neural network in analog domain, the problem of high energy consumption of complex digital operations is avoided while ensuring the precision of the neural network, and the hardware energy efficiency performance of deep neural network applications is significantly improved.

In the design and implementation of mixed-signal operational circuits for deep neural networks, the computing structure based on switched capacitor is a technical route receiving widespread attention. Based on the design principle of the switched capacitor operational circuit of the deep neural network, the amount of charge stored on the capacitor array is used as the measurement of change in the physical state, the charging and discharging of the capacitor and the redistribution process of the charge among the capacitor arrays are controlled by the switch, and the analog voltage value corresponding to the digital operation or the logical operation is established.

Focusing on computationally intensive algorithms, many literature in recent years have designed logic operational circuits or matrix convolution operational circuits based on switched capacitor arrays, which achieves significant energy savings compared to digital operations while ensuring the speed and precision of neural network operations. However, most of the existing designs are based on the principle of charge sharing among capacitors. During the computation process, the capacitor plates need to be charged or discharged by the voltage with an amplitude equal to the power supply voltage, which causes a bottleneck in the energy consumption of the switched capacitor adder circuit. Also, the existing switched capacitor adder circuit design requires the construction of a unit weight capacitor array with the same size as the amount of add computation data, which usually results in a large capacitor area overhead in complex add computations.

In summary, how to further reduce the area overhead and improve the energy efficiency while ensuring the working speed and precision of the mixed-signal operational circuit is still a key issue to be solved in the field of mixed-signal operational circuit design.

SUMMARY

In view of the above defects or improvement needs of the existing technology, the disclosure provides a mixed-signal operational circuit, aiming to reduce the area overhead of the operational circuit and improve the energy efficiency of computations while ensuring the working speed and precision.

In order to achieve the above purposes, in the first aspect, the disclosure provides a mixed-signal logic operational circuit, which includes a first MOS transistor, a second MOS transistor, a third MOS transistor, a first capacitor, a second capacitor, a logic operational channel, and a control unit. A terminal of the first capacitor serves as the output terminal VO of the logic operational circuit, and the other terminal is connected to ground. The source of the first MOS transistor is connected to the drain of the second MOS transistor. The source of the second MOS transistor, the drain of the third MOS transistor, and a terminal of the second capacitor are connected. The source of the third MOS transistor is connected to the other terminal of the second capacitor to connect with a power supply voltage VDD.

When logical operations is performed, input data is fed into the logic operational channel by the control unit. Before each input, the first MOS transistor is controlled to be turned off and the third MOS transistor is turned on to charge the second capacitor to the voltage VDD, and then the first MOS transistor is controlled to be turned on and the third MOS transistor is turned off.

The logic operational channel is used to control the connection state between the drain terminal of the first MOS transistor and the output terminal VO based on the level state of the input data.

Further preferably, when the logical operation implemented by the logic operational circuit is an AND summing operation, i.e., $$\sum_{i=1}^{N} w_i \& x_i,$$

related description is as follows.

The data to be logically operated includes the data signal $x_i$ and the weight signal $w_i$, in which $i=1,2,\ldots,N$, and N is the number of the data signals or the weight signals.

The control unit feds a pair of data and weight signal, $\{x_i, w_i\}$ into the logic operational channel at each time i.

The logic operational channel is used to connect the drain terminal of the first MOS transistor to the output terminal VO after receiving inputs of $x_i$ and $w_i$ when $x_i$ and $w_i$ are both high level to perform voltage superposition on the output terminal VO, while not being used to connect the drain terminal of the first MOS transistor to the output terminal VO when $x_i$ and $w_i$ are not both high level to no longer perform voltage superposition on the output terminal VO. The gate of the second MOS transistor is connected with the bias voltage to ensure that the voltage superimposed each time is of the same amount. The final voltage value of the output terminal VO is the voltage value corresponding to the AND summing operation result $$\sum_{i=1}^{N} w_i \& x_i.$$

When the logical operation implemented by the logic operational circuit is an OR summing operation, i.e., $$\sum_{i=1}^{N} w_i \mid x_i,$$

related description is as follows.

The data to be logically operated includes the data signal $x_i$ and the weight signal $w_i$, in which i=1,2, ..., N, and N is the total quantity of the data signals or the weight signals.

The control unit feds a pair of data and weight signal, $\{x_i, w_i\}$ into the logic operational channel at each time i.

The logic operational channel is used to connect the drain terminal of the first MOS transistor to the output terminal VO after receiving inputs of $x_i$ and $w_i$ when one of $x_i$ and $w_i$ is high level to perform voltage superposition on the output terminal VO, while not being used to connect the drain terminal of the first MOS transistor to the output terminal VO when both $x_i$ and $w_i$ are not high level to no longer perform voltage superposition on the output terminal VO. The gate of the second MOS transistor is connected with the bias voltage to ensure that the voltage superimposed each time is of the same amount. The final voltage value of the output terminal VO is the voltage value corresponding to the OR summing operation result $$\sum_{i=1}^{N} w_i \mid x_i.$$

When the logical operation implemented by the logic operational circuit is a NOT summing operation, i.e., $$\sum_{i=1}^{N} \overline{x_i},$$

related description is as follows.

The data to be logically operated includes the data signal $x_i$ and the weight signal $w_i$, in which i=1,2, ..., N, and N is the total quantity of the data signals or the weight signals.

The control unit feds a pair of data and weight signal, $\{x_i, w_i\}$ into the logic operational channel at each time i.

The logic operational channel is used to connect the drain terminal of the first MOS transistor to the output terminal VO after receiving input of $x_i$ when $x_i$ is low level to perform voltage superposition on the output terminal VO, while not being used to connect the drain terminal of the first MOS transistor to the output terminal VO when $x_i$ is not low level to no longer perform voltage superposition on the output terminal VO. The gate of the second MOS transistor is connected with the bias voltage to ensure that the voltage superimposed each time is of the same amount. The final voltage value of the output terminal VO is the voltage value corresponding to the NOT summing operation result $$\sum_{i=1}^{N} \overline{x_i}.$$

When the logical operation implemented by the logic operational circuit is an NAND summing operation, i.e., $$\sum_{i=1}^{N} \overline{w_i \& x_i},$$

related description is as follows.

The data to be logically operated includes the data signal $x_i$ and the weight signal $w_i$, in which i=1,2, ..., N, and N is the total quantity of the data signals or the weight signals.

The control unit feds a pair of data and weight signal, $\{x_i, w_i\}$ into the logic operational channel at each time i.

The logic operational channel is used to connect the drain terminal of the first MOS transistor to the output terminal VO after receiving inputs of $x_i$ and $w_i$ when one of $x_i$ and $w_i$ is low level to perform voltage superposition on the output terminal VO, while not being used to connect the drain terminal of the first MOS transistor to the output terminal VO when both $x_i$ and $w_i$ are not low level to no longer perform voltage superposition on the output terminal VO. The gate of the second MOS transistor is connected with the bias voltage to ensure that the voltage superimposed each time is of the same amount. The final voltage value of the output terminal VO is the voltage value corresponding to the NAND summing operation result $$\sum_{i=1}^{N} \overline{w_i \& x_i}.$$

When the logical operation implemented by the logic operational circuit is a NOR summing operation, i.e., $$\sum_{i=1}^{N} \overline{w_i \mid x_i},$$

related description is as follows.

The data to be logically operated includes the data signal $x_i$ and the weight signal $w_i$, in which i=1,2, ..., N, and N is the total quantity of the data signals or the weight signals.

The control unit feds a pair of data and weight signal, $\{x_i, w_i\}$ into the logic operational channel at each time i.

The logic operational channel is used to connect the drain terminal of the first MOS transistor to the output terminal VO after receiving inputs of $x_i$ and $w_i$ when $x_i$ and $w_i$ are both low level to perform voltage superposition on the output terminal VO, while not being used to connect the drain terminal of the first MOS transistor to the output terminal VO when $x_i$ and $w_i$ are not both low level to no longer perform voltage superposition on the output terminal VO. The gate of the second MOS transistor is connected with the bias voltage to ensure that the voltage superimposed each time is of the same amount. The final voltage value of the output terminal VO is the voltage value corresponding to the NOR summing operation result $$\sum_{i=1}^{N} \overline{w_i \mid x_i}.$$

When the logical operation implemented by the logic operational circuit is an XNOR summing operation, i.e., $$\sum_{i=1}^{N} w_i \odot x_i,$$

related description is as follows.

The data to be logically operated includes the data signal $x_i$ and the weight signal $w_i$, in which i=1,2, ..., N, and N is the total quantity of the data signals or the weight signals.

The control unit feds a pair of data and weight signal, $\{x_i, w_i\}$ into the logic operational channel at each time i.

The logic operational channel is used to connect the drain terminal of the first MOS transistor to the output terminal VO after receiving inputs of $x_i$ and $w_i$ when $x_i$ and $w_i$ are of the same level to perform voltage superposition on the output terminal VO, while not being used to connect the drain terminal of the first MOS transistor to the output terminal VO when $x_i$ and $w_i$ are not of the same level to no longer perform voltage superposition on the output terminal VO. The gate of the second MOS transistor is connected with the bias voltage to ensure that the voltage superimposed each time is of the same amount. The final voltage value of the output terminal VO is the voltage value corresponding to the XNOR summing operation result $$\sum_{i=1}^{N} w_i \odot x_i.$$

When the logical operation implemented by the logic operational circuit is an XOR summing operation, i.e., $$\sum_{i=1}^{N} w_i \oplus x_i,$$

related description is as follows.

The data to be logically operated includes the data signal $x_i$ and the weight signal $w_i$, in which i=1,2, ..., N, and N is the total quantity of the data signals or the weight signals.

The control unit feds a pair of data and weight signal, $\{x_i, w_i\}$ into the logic operational channel at each time i.

The logic operational channel is used to connect the drain terminal of the first MOS transistor to the output terminal VO after receiving inputs of $x_i$ and $w_i$ when $x_i$ and $w_i$ are not of the same level to perform voltage superposition on the output terminal VO, while not being used to connect the drain terminal of the first MOS transistor to the output terminal VO when $x_i$ and $w_i$ are of the same level to no longer performed voltage superposition on the output terminal VO. The gate of the second MOS transistor is connected with the bias voltage to ensure that the voltage superimposed each time is of the same amount. The final voltage value of the output terminal VO is the voltage value corresponding to the XOR summing operation result $$\sum_{i=1}^{N} w_i \oplus x_i.$$

Further preferably, when the logical operation implemented by the logic operational circuit is the AND summing operation, the logic operational channel includes a fourth MOS transistor and a fifth MOS transistor. The source of the fourth MOS transistor is connected to the drain of the fifth MOS transistor, and the drain of the fourth MOS transistor is connected to the output terminal VO. The source of the fifth MOS transistor is connected to the drain of the first MOS transistor. If the fourth MOS transistor is a PMOS transistor, then the gate thereof is connected with the inverting signal of $x_i$; and if the fourth MOS transistor is an NMOS transistor, then the gate thereof is connected with $x_i$. If the fifth MOS transistor is a PMOS transistor, then the gate thereof is connected with the inverting signal of $w_i$; and if the fifth MOS transistor is an NMOS transistor, then the gate thereof is connected with $w_i$.

When the logical operation implemented by the logic operational circuit is the OR summing operation, the logic operational channel includes a fourth MOS transistor and a fifth MOS transistor. The source of the fourth MOS transistor and the source of the fifth MOS transistor are jointly connected to the drain of the first MOS transistor, and the drain of the fourth MOS transistor and the drain of the fifth MOS transistor are jointly connected to the output terminal VO. If the fourth MOS transistor is a PMOS transistor, then the gate thereof is connected with the inverting signal of $x_i$; and if the fourth MOS transistor is an NMOS transistor, then the gate thereof is connected with $x_i$. If the fifth MOS transistor is a PMOS transistor, then the gate thereof is connected with the inverting signal of $w_i$; and if the fifth MOS transistor is an NMOS transistor, then the gate thereof is connected with $w_i$.

When the logical operation implemented by the logic operational circuit is the NOT summing operation, the logic operational channel includes a fourth MOS transistor. The source of the fourth MOS transistor is connected to the drain of the first MOS transistor, and the drain of the fourth MOS transistor is connected to the output terminal VO. If the fourth MOS transistor is a PMOS transistor, then the gate thereof is connected with $x_i$; and if the fourth MOS transistor is an NMOS transistor, then the gate thereof is connected with the inverting signal of $x_i$.

When the logical operation implemented by the logic operational circuit is the NAND summing operation, the logic operational channel includes a fourth MOS transistor and a fifth MOS transistor. The source of the fourth MOS transistor and the source of the fifth MOS transistor are jointly connected to the drain of the first MOS transistor, and the drain of the fourth MOS transistor and the drain of the fifth MOS transistor are jointly connected to the output terminal VO. If the fourth MOS transistor is a PMOS transistor, then the gate thereof is connected with $w_i$; and if the fourth MOS transistor is an NMOS transistor, then the gate thereof is connected with the inverting signal of $w_i$. If the fifth MOS transistor is a PMOS transistor, then the gate thereof is connected with $x_i$; and if the fifth MOS transistor is an NMOS transistor, then the gate thereof is connected with the inverting signal of $x_i$.

When the logical operation implemented by the logic operational circuit is the NOR summing operation, the logic operational channel includes a fourth MOS transistor and a fifth MOS transistor. The source of the fourth MOS transistor is connected to the drain of the fifth MOS transistor, and the drain of the fourth MOS transistor is connected to the output terminal VO. The source of the fifth MOS transistor is connected to the drain of the first MOS transistor. If the fourth MOS transistor is a PMOS transistor, then the gate thereof is connected with $w_i$; and if the fourth MOS transistor is an NMOS transistor, then the gate thereof is connected with the inverting signal of $w_i$. If the fifth MOS transistor is a PMOS transistor, then the gate thereof is connected with $x_i$; and if the fifth MOS transistor is an NMOS transistor, then the gate thereof is connected with the inverting signal of $x_i$.

When the logical operation implemented by the logic operational circuit is the XNOR summing operation, the logic operational channel includes a fourth MOS transistor, a fifth MOS transistor, a sixth MOS transistor, and a seventh MOS transistor. The source of the fourth MOS transistor is connected to the drain of the fifth MOS transistor, and the source of the sixth MOS transistor is connected to the drain of the seventh MOS transistor. The drain of the fourth MOS transistor is connected to the drain of the sixth MOS transistor to connect with the output terminal VO. The source of the fifth MOS transistor and the source of the seventh MOS transistor are connected to the drain of the first MOS transistor. If the fourth MOS transistor is a PMOS transistor, then the gate thereof is connected with $x_i$; and if the fourth MOS transistor is an NMOS transistor, then the gate thereof is connected with the inverting signal of $x_i$. If the fifth MOS transistor is a PMOS transistor, then the gate thereof is connected with $w_i$; and if the fifth MOS transistor is an NMOS transistor, then the gate thereof is connected with the inverting signal of $w_i$. If the sixth MOS transistor is a PMOS transistor, then the gate thereof is connected with the inverting signal of $x_i$; and if the sixth MOS transistor is an NMOS transistor, then the gate thereof is connected with $x_i$. If the seventh MOS transistor is a PMOS transistor, then the gate thereof is connected with the inverting signal of $w_i$; and if the seventh MOS transistor is an NMOS transistor, then the gate thereof is connected with $w_i$.

When the logical operation implemented by the logic operational circuit is the XOR summing operation, the logic operational channel includes a fourth MOS transistor, a fifth MOS transistor, a sixth MOS transistor, and a seventh MOS transistor. The source of the fourth MOS transistor is connected to the drain of the fifth MOS transistor, and the source of the sixth MOS transistor is connected to the drain of the seventh MOS transistor. The drain of the fourth MOS transistor is connected to the drain of the sixth MOS transistor to connect with the output terminal VO. The source of the fifth MOS transistor and the source of the seventh MOS transistor are connected to the drain of the first MOS transistor. If the fourth MOS transistor is a PMOS transistor, then the gate thereof is connected with the inverting signal of $x_i$; and if the fourth MOS transistor is an NMOS transistor, then the gate thereof is connected with $x_i$. If the fifth MOS transistor is a PMOS transistor, then the gate thereof is connected with $w_i$; and if the fifth MOS transistor is an NMOS transistor, then the gate thereof is connected with the inverting signal of $w_i$. If the sixth MOS transistor is a PMOS transistor, then the gate thereof is connected with $x_i$; and if the sixth MOS transistor is an NMOS transistor, then the gate thereof is connected with the inverting signal of $x_i$. If the seventh MOS transistor is a PMOS transistor, then the gate thereof is connected with the inverting signal of $w_i$; and if the seventh MOS transistor is an NMOS transistor, then the gate thereof is connected with $w_i$.

Further preferably, the logic operational circuit further includes a MOS transistor C. The drain of the MOS transistor C is connected to the output terminal VO, and the source is connected to the ground.

The control unit is further used to reset the logic operational circuit before performing the logical operation. The MOS transistor C is controlled to be turned on, the first MOS transistor and the third MOS transistor are turned off, so as to reset the output terminal VO to the ground. When performing the logical operation, the MOS transistor C is controlled to be turned off.

Further preferably, the control unit is further used to adjust the conduction degree of the second MOS transistor by adjusting the value of the preset bias voltage, thereby the value of the discharge current of the second capacitor is controlled, and the amount of the superimposed voltage is adjusted.

Further preferably, the control unit is further configured to input a clear signal to the gate of the first MOS transistor to control the switching state of the first MOS transistor, and to input a precharge signal to the gate of the third MOS transistor to control the switching state of the third MOS transistor.

In the second aspect, the disclosure provides a mixed-signal convolution operational circuit, which includes a first MOS transistor, a second MOS transistor, a third MOS transistor, a first capacitor, a second capacitor, a third capacitor, an arithmetic operational channel, and a control unit.

A terminal of the first capacitor serves as a non-inverting output terminal VP of the convolution operational circuit, and the other terminal is connected to the ground. A terminal of the second capacitor serves as an inverting output terminal VN of the convolution operational circuit, and the other terminal is connected to the ground.

The source of the first MOS transistor is connected to the drain of the second MOS transistor. The source of the second MOS transistor, the drain of the third MOS transistor, and a terminal of the third capacitor are connected. The source of the third MOS transistor is connected to the other terminal of the third capacitor to connect with the power supply voltage VDD.

The control unit is used to input the data signal $x_i$ and the weight signal $w_i$ into the arithmetic operational channel when performing the convolution operation. Before each set of $x_i$ and $w_i$ is input, the first MOS transistor is controlled to be turned off and the third MOS transistor is turned on to charge the third capacitor to the voltage VDD. Then the first MOS transistor is controlled to be turned on, the third MOS transistor is turned off and $x_i$ and $w_i$ are input into the arithmetic operational channel. i=1,2, . . . , N; and N is the length of data to be convolved.

The arithmetic operational channel is used to connect the drain terminal of the first MOS transistor to the non-inverting output terminal VP after receiving inputs of $x_i$ and $w_i$ when $x_i$ and $w_i$ are of the same level to perform voltage superposition on the non-inverting output terminal VP, and connect the drain terminal of the first MOS transistor to the inverting output terminal VN when $x_i$ and $w_i$ are of opposite levels to perform voltage superposition on the inverting output terminal VN. The gate of the second MOS transistor is connected with a preset bias voltage to ensure that the voltage superimposed each time is of the same amount.

A final voltage difference between the non-inverting output terminal VP and the inverting output terminal VN is the voltage value corresponding to the convolution operation result $\Sigma_{i=1}^{N} w_i x_i$.

Further preferably, the arithmetic operational channel includes fourth to eleventh MOS transistors. The source of the fourth MOS transistor, the source of the fifth MOS transistor, the source of the eighth MOS transistor, and the source of the ninth MOS transistor are jointly connected to the drain of the first MOS transistor. The drain of the fourth MOS transistor is connected to the source of the sixth MOS transistor; the drain of the fifth MOS transistor is connected to the source of the seventh MOS transistor; the drain of the eighth MOS transistor is connected to the source of the tenth MOS transistor; the drain of the ninth MOS transistor is connected to the source of the eleventh MOS transistor; the drain of the sixth MOS transistor and the drain of the tenth MOS transistor are jointly connected to the non-inverting output terminal VP; the drain of the seventh MOS transistor and the drain of the eleventh MOS transistor are jointly connected to the inverting output terminal VN.

If the fourth MOS transistor is a PMOS transistor, then the gate thereof is connected to $w_i$; and if the fourth MOS transistor is an NMOS transistor, then the gate thereof is connected to the inverting signal of $w_i$.

If the fifth MOS transistor is a PMOS transistor, then the gate thereof is connected to $w_i$; and if the fifth MOS transistor is an NMOS transistor, then the gate thereof is connected to the inverting signal of $w_i$.

If the sixth MOS transistor is a PMOS transistor, then the gate thereof is connected to $x_i$; and if the sixth MOS transistor is an NMOS transistor, then the gate thereof is connected to the inverting signal of $x_i$.

If the eleventh MOS transistor is a PMOS transistor, then the gate thereof is connected to $x_i$; and if the eleventh MOS transistor is an NMOS transistor, then the gate thereof is connected to the inverting signal of $x_i$.

If the seventh MOS transistor is a PMOS transistor, then the gate thereof is connected to the inverting signal of $x_i$; and if the seventh MOS transistor is an NMOS transistor, then the gate thereof is connected to $x_i$.

If the tenth MOS transistor is a PMOS transistor, then the gate thereof is connected to the inverting signal of $x_i$; and if the tenth MOS transistor is an NMOS transistor, then the gate thereof is connected to $x_i$.

If the eighth MOS transistor is a PMOS transistor, then the gate thereof is connected to the inverting signal of $w_i$; and if the eighth MOS transistor is an NMOS transistor, then the gate thereof is connected to $w_i$.

If the ninth MOS transistor is a PMOS transistor, then the gate thereof is connected to the inverting signal of $w_i$; and if the ninth MOS transistor is an NMOS transistor, then the gate thereof is connected to $w_i$.

Further preferably, the convolution operational circuit further includes a MOS transistor A and a MOS transistor B, in which the drain of the MOS transistor A is connected to the non-inverting output terminal VP, and the source is connected to the ground; and the drain of the MOS transistor B is connected to the inverting output terminal VN, and the source is connected to the ground.

The control unit is further used to reset the DAC-based convolution operational circuit before performing the convolution operation. The MOS transistor A and the MOS transistor B are controlled to be turned on, and the first MOS transistor and the third MOS transistor are turned off, so as to reset the non-inverting output terminal VP and the inverting output terminal VN to the ground. When performing the convolution operation, the MOS transistor A and the MOS transistor B are controlled to be turned off.

Further preferably, the control unit is further used to adjust the conduction degree of the second MOS transistor by adjusting the value of the preset bias voltage, thereby the value of the discharge current of the third capacitor is controlled, and the amount of the superimposed voltage is adjusted.

Further preferably, the control unit is further configured to input a clear signal to the gate of the first MOS transistor to control the switching state of the first MOS transistor, and to input a precharge signal to the gate of the third MOS transistor to control the switching state of the third MOS transistor.

In the third aspect, the disclosure provides a switched capacitor operational circuit, which includes M charge injection computing units, M first connection capacitors, and M second connection capacitors, in which the charge injection computing unit is the logic operational circuit provided by the first aspect of the disclosure or the convolution operational circuit provided by the second aspect of the disclosure.

When the charge injection computing unit is the logic operational circuit provided by the first aspect of the disclosure, related description is as follows.

Each of the output terminals VO of the M charge injection computing units is connected to a terminal of the M connection capacitors in a one-to-one mapping. The other terminals of the M connection capacitors are connected together and serve as an output terminal VOUT of the switched capacitor operational circuit.

The outputs of the output terminals VO of the M charge injection computing units are superimposed at the output terminal VOUT through the corresponding connection capacitor.

A logical operation is divided into M groups of sub-logical operations. A charge injection computing unit is used to implement a sub-logical operation. The output terminal VOUT is the voltage value corresponding to the logical operation result desired.

When the charge injection computing unit is the convolution operational circuit provided by the second aspect of the disclosure:

Each of the non-inverting output terminals VP of the M charge injection computing units is connected to a terminal of the M first connection capacitors in a one-to-one mapping. The other terminals of the M first connection capacitors are connected together and serve as a non-inverting output terminal VOUTP of the switched capacitor operational circuit.

Each of the inverting output terminal VN of the M charge injection computing units is connected to a terminal of the M second connection capacitor in a one-to-one mapping. The other terminals of the M second connection capacitor are connected together and serve as an inverting output terminal VOUTN of the switched capacitor operational circuit.

The outputs of the non-inverting output terminals VP of the M charge injection computing units are superimposed at the non-inverting output terminal VOUTP through the corresponding first connection capacitors.

The outputs of inverting output terminals VN of the M charge injection computing units are superimposed at the inverting output terminal VOUTN through the corresponding second connection capacitor.

A convolution operation is divided into M groups of sub-convolution operations. A charge injection computing unit is used to implement a sub-convolution operation. A final voltage difference between the non-inverting output terminal VOUTP and the inverting output terminal VOUTN is the voltage value corresponding to the convolution operation result desired.

Further preferably, when the charge injection computing unit is the logic operational circuit provided in the first aspect of the disclosure, the switched capacitor operational circuit further includes a reset circuit connected to the output terminal VOUT.

When the charge injection computing unit is the convolution operational circuit provided in the second aspect of the disclosure, the switched capacitor operational circuit further includes a reset circuit respectively connected to the non-inverting output terminal VOUTP and the inverting output terminal VOUTN.

In the fourth aspect, the disclosure provides an electronic chip, which includes the logic operational circuit provided by the first aspect of the disclosure, the convolution operational circuit provided by the second aspect of the disclosure, or the switched capacitor operational circuit provided by the third aspect of the disclosure.

Generally speaking, through the above technical solutions conceived by the disclosure, beneficial effects can be achieved as follows.

The first aspect of the disclosure provides a logic operational circuit, which is a charge injection logic based on transmission channel and capacitor, in which the first capacitor is used to determine the output terminal of the logic operational circuit, the second capacitor is used to provide a certain voltage, and the logic operational channel selects the charge channel from the second capacitor to the first capacitor based on the data signal of each input, so as to superimpose the voltage value to the output terminal to achieve digital-to-analog conversion (DAC). Time-division multiplexing is achieved through successive injection, thereby an analog voltage value related to the logical operation result is established at the output terminal. The logical operation is realized by using only two capacitors, and there is no need to build a unit weight capacitor array equal to the quantity of logical operations, which reduces the capacitor area overhead significantly, thereby the area overhead of the operational circuit is reduced and the energy efficiency of the operation is improved while ensuring the working speed and precision.

Further, in the logic operational circuit provided by the disclosure, the logic operational channel comprises multiple MOS transistors, and a channel is formed by four situations comprising a case of the data signal $x_i$ and $w_i$ both being low level, a case of the data signal $x_i$ and $w_i$ both being high level, a case of the data signal $x_i$ being low level and $w_i$ being high level, and a case of the data signal $x_i$ being high level and $w_i$ being low level, which determines whether a charge channel is turned on. Through embedding logical operations in the charge channel, the charge injection computing unit able to implement various basic logic is established, which reduces the energy consumption of logical operations in the neural network significantly, and further, the energy efficiency of the operation of the circuit is improved.

The second aspect of the disclosure provides a convolution operational circuit, in which the first capacitor and the second capacitor are used to determine the non-inverting output terminal and the inverting output terminal of the convolution operational circuit, and the third capacitor is used to provide a certain voltage. The arithmetic operational channel selects the positive charge channel from the third capacitor to the first capacitor or the inverting charge channel from the third capacitor to the second capacitor based on the data signal and weight signal of each input to superimpose voltage values at the non-inverting output terminal or the inverting output terminal. Time-division multiplexing is achieved through successive injection, thereby an analog voltage value related to the convolution operation result is established at the differential output terminal. The convolution operation is realized by using only three capacitors, and there is no need to build a unit weight capacitor array equal to the quantity of addition operation data, which reduces the capacitor area overhead significantly, thereby the area overhead of the operational circuit is reduced and the energy efficiency of the operation is improved while ensuring the working speed and precision.

Further, in the convolution operational circuit provided by the disclosure, the arithmetic operational channel comprises multiple MOS transistors, and the channel is formed by four situations comprising a case of the data signal $x_i$ and weight signal $w_i$ both being low level, a case of the data signal $x_i$ and weight signal $w_i$ both being high level, a case of the data signal $x_i$ being low level and the weight signal $w_i$ being high level, and a case of the data signal $x_i$ being high level and the weight signal $w_i$ being low level. The channel comprising the four situations selects the positive charge channel or the inverting charge channel. Binary arithmetic multiplication operation logic is embedded in the charge channel, which reduces the energy consumption of multiplication operations in the neural network convolution operation significantly, and further, the energy efficiency of the operation of the circuit is improved.

The third aspect of the disclosure provides a switched capacitor operational circuit. By integrating the successive injection computation method and the parallel computing method, a charge injection switched-capacitor operational circuit that can flexibly weigh core computation indicators is established, which can flexibly obtain an optimal design implementation in terms of core indicators such as hardware overhead, computing performance, and computing precision.

DESCRIPTION OF THE EMBODIMENTS

In order to make the purpose, technical solutions, and advantages of the disclosure more clear, the disclosure will be further described in detail below with reference to the accompanying drawings and embodiments. It should be understood that the specific embodiments described here are only used to explain the disclosure and the embodiments, and are not intended to limit the disclosure. In addition, the technical features involved in the various embodiments of the disclosure described below may be combined with each other as long as the features do not conflict with each other.

Figure 1:
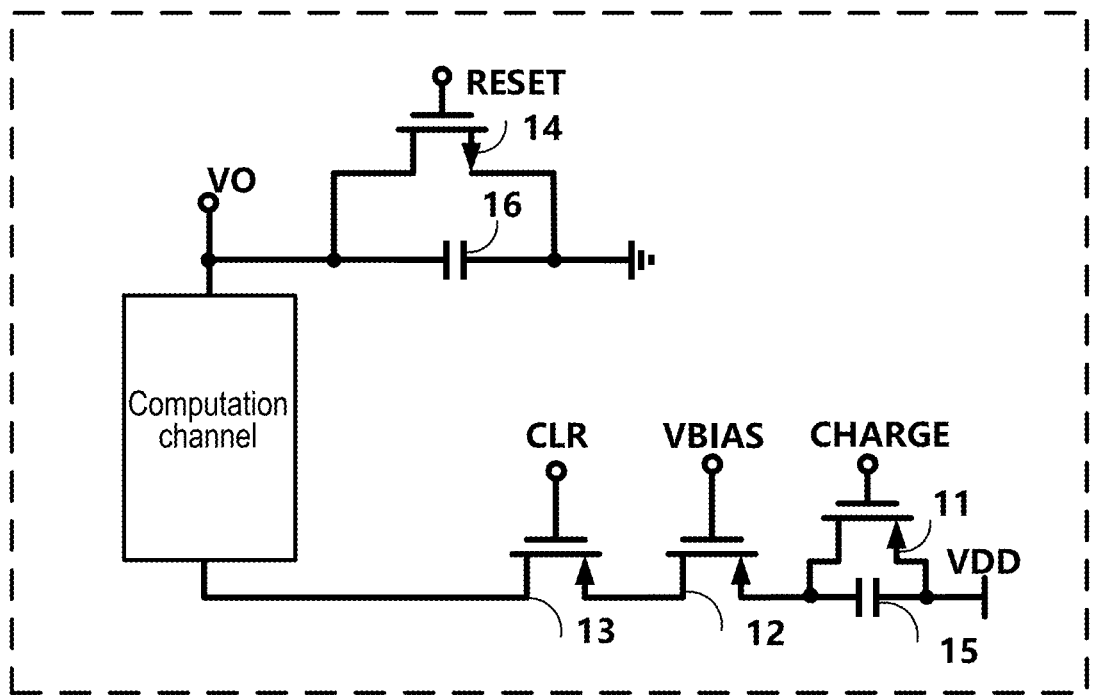
FIG. 1 is a schematic structural diagram of a mixed-signal logic operational circuit provided by the first aspect of the disclosure.

In order to achieve the above purposes, in the first aspect, the disclosure provides a mixed-signal logic operational circuit, which is a charge injection logic operational circuit based on transmission channel and capacitor (denoted as TPC CI logic circuit), used to implement various basic logical operations (AND, OR, NOT, NAND, NOR, XNOR, and XOR logical operations), as shown in FIG. 1, including a first MOS transistor 13, a second MOS transistor 12, a third MOS transistor 11, a first capacitor 16, a second capacitor 15, a logic operational channel, and a control unit. A terminal of the first capacitor serves as an output terminal VO of the logic operational circuit, and the other terminal is connected to ground. The source of the first MOS transistor is connected to the drain of the second MOS transistor. The source of the second MOS transistor, the drain of the third MOS transistor, and a terminal of the second capacitor are connected. The source of the third MOS transistor is connected to the other terminal of the second capacitor to connect with a power supply voltage VDD.

When a logical operation is performed, input data is fed into the logic operational channel by the control unit. Before each input, the first MOS transistor is controlled to be turned off and the third MOS transistor is turned on to charge the second capacitor to the voltage VDD, and then the first MOS transistor is controlled to be turned on and the third MOS transistor is turned off.

The logic operational channel is used to control the connection state between the drain terminal of the first MOS transistor and the output terminal VO based on the level state of the input data.

It should be noted that the first MOS transistor 13, the second MOS transistor 12, and the third MOS transistor 11 may be PMOS transistors or NMOS transistors, and the disclosure is not limited thereto.

Specifically, the logic operational circuit may be an AND summing operational circuit, an OR summing operational circuit, a NOT summing operational circuit, a NAND summing operational circuit, a NOR summing operational circuit, a XNOR summing operational circuit, or a XOR summing operational circuit. Correspondingly, the logic operational channel may be an AND summing operational channel, an OR summing operational channel, a NOT summing operational channel, a NAND summing operational channel, a NOR summing operational channel, an identical-OR summing operational channel, or a XOR summing operational channel.

It should be noted that the specific operation process of each logical operation is as follows. When the logical operation result of the input data is 1, the logic operational circuit selects the charge injection channel from the second capacitor to the first capacitor, and after completing one charge injection, a voltage of a certain value is superimposed to the output terminal VO. When the logical operation result of the input data is 0, the logic operational circuit disconnects the charge injection channel from the second capacitor to the first capacitor, and the voltage of the output terminal remains unchanged. Taking the above working process as a cycle, the DAC-based logic operational circuit may establish an analog voltage value related to the logical operation summation result at the output terminal through a successive injection process based on the logical operation result of the input value.

Preferably, in an optional implementation, the control unit is further configured to input a clear signal to the gate of the first MOS transistor to control the switching state of the first MOS transistor, and to input a precharge signal to the gate of the third MOS transistor to control the switching state of the third MOS transistor.

Preferably, in an optional implementation, the logic operational circuit further includes a MOS transistor C. The drain of the MOS transistor C is connected to the output terminal VO, and the source is connected to the ground.

The control unit is also used to reset the logic operational circuit before performing the logical operation, in which the MOS transistor C is controlled to be turned on, and the first MOS transistor and the third MOS transistor are turned off, so as to reset the output terminal VO to the ground. When performing the logical operation, the MOS transistor A is controlled to be turned off.

It should be noted that the MOS transistor C may be a PMOS transistor or an NMOS transistor, and the disclosure is not limited thereto.

Detailed description will be provided below with reference to specific embodiments, and in the following embodiments, $w_i$ is a high-level signal or a low-level signal; $x_i$ is a high-level signal or a low-level signal; and the high-level signal corresponds to the value 1, and the low-level signal corresponds to the value 0.

Example 1

In this embodiment, the logical operation implemented by the logic operational circuit is the AND summing operation (that is, AND logical operation summation), the logic operational circuit is the AND summing operational circuit, and the logic operational channel is the AND summing operational channel. The data to be logically operated includes the data signal $x_i$ and the weight signal $w_i$, in which i=1, 2, . . . , N, and N is the total quantity of the data signals or the weight signals.

The control unit is used to input the data signal $x_i$ and the weight signal $w_i$ into the AND summing operational channel when performing the AND summing operation. Before each group of $x_i$ and $w_i$ is input, the first MOS transistor is controlled to be turned off and the third MOS transistor is turned on to charge the second capacitor to the voltage VDD, then the first MOS transistor is controlled to be turned on and the third MOS transistor is turned off, and then $x_i$ and $w_i$ are input into the AND summing operational channel.

The AND summing operational channel is used to connect the drain terminal of the first MOS transistor to the output terminal VO after receiving inputs of $x_i$ and $w_i$ when $x_i$ and $w_i$ are both high level to perform voltage superposition on the output terminal VO, and not connect the drain terminal of the first MOS transistor to the output terminal VO when $x_i$ and $w_i$ are not both high level to no longer perform voltage superposition on the output terminal VO. The gate of the second MOS transistor is connected with the bias voltage to ensure that the voltage superimposed each time is of the same amount. The final voltage value of the output terminal VO is the voltage value corresponding to the AND summing operation result $$\sum_{i=1}^{N} w_i \ \& \ x_i.$$

Specifically, there are various ways to implement the AND summing operational channel.

In an optional implementation, the AND summing operational channel includes a fourth MOS transistor and a fifth MOS transistor. The source of the fourth MOS transistor is connected to the drain of the fifth MOS transistor, and the drain of the fourth MOS transistor is connected to the output terminal VO. The source of the fifth MOS transistor is connected to the drain of the first MOS transistor. If the fourth MOS transistor is a PMOS transistor, then the gate thereof is connected with the inverting signal of $x_i$; and if the fourth MOS transistor is an NMOS transistor, then the gate thereof is connected with $x_i$. If the fifth MOS transistor is a PMOS transistor, then the gate thereof is connected with the inverting signal of $w_i$; and if the fifth MOS transistor is an NMOS transistor, then the gate thereof is connected with $w_i$.

In another optional implementation, the AND summing operational channel includes a fourth MOS transistor, a fifth MOS transistor, a sixth MOS transistor, and a seventh MOS transistor. The drain of the fourth MOS transistor is connected to the output terminal VO, and the source of the fourth MOS transistor is connected to the drain of the fifth MOS transistor. The source of the fifth MOS transistor is connected to the drain of the sixth MOS transistor. The source of the sixth MOS transistor is connected to the drain of the seventh MOS transistor. The source of the seventh MOS transistor is connected to the drain of the first MOS transistor. If the fourth MOS transistor is a PMOS transistor, then the gate thereof is connected with the inverting signal of $x_i$; and if the fourth MOS transistor is an NMOS transistor, then the gate thereof is connected with $x_i$. If the fifth MOS transistor is a PMOS transistor, then the gate thereof is connected with the inverting signal of $x_i$; and if the fifth MOS transistor is an NMOS transistor, then the gate thereof is connected with $x_i$. If the sixth MOS transistor is a PMOS transistor, then the gate thereof is connected with the inverting signal of $w_i$; and if the sixth MOS transistor is an NMOS transistor, then the gate thereof is connected with $w_i$. If the seventh MOS transistor is a PMOS transistor, then the gate thereof is connected with the inverting signal of $w_i$; and if the seventh MOS transistor is an NMOS transistor, and then the gate thereof is connected with $w_i$.

It should be noted that the input positions of $x_i$ and $w_i$ mentioned above may be interchanged, and the disclosure is not limited thereto.

Figure 2:
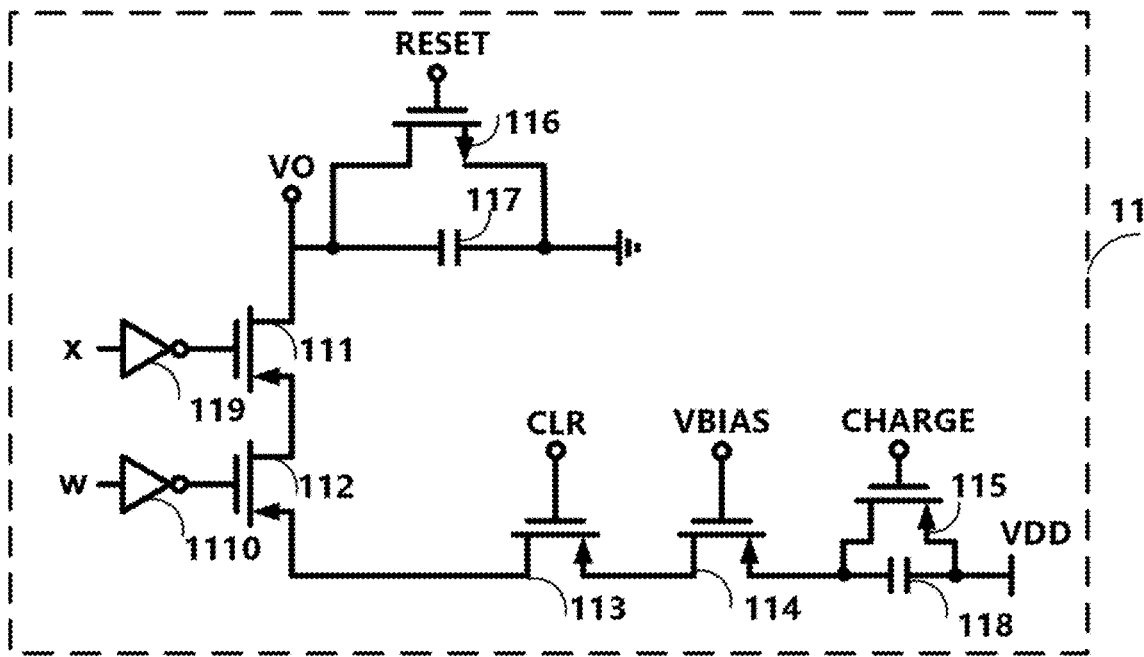
FIG. 2 is a schematic structural diagram of an AND summing operational circuit provided in Example 1 of the disclosure.

The following is a detailed description of an implementation. Specifically, FIG. 2 is the first specific implementation of the AND summing operational circuit according to the disclosure. Taking all the MOS transistors as PMOS as an example, in this embodiment, a AND summing operational circuit 11 includes 6 MOS transistors (111, 112, 113, 114, 115, and 116), two capacitors (117 and 118), and two inverting logic circuits (119 and 1110). The MOS transistors 113, 114, and 115 are respectively the first to third MOS transistors, the MOS transistors 111 and 112 are respectively the fourth and fifth MOS transistors, and the MOS transistor 116 is the MOS transistor C. Specifically, the source of the MOS transistor 112 is connected to the drain of the MOS transistor 113. The source of the MOS transistor 111 is connected to the drain of the MOS transistor 112. The drain of the MOS transistor 111 and the drain of the MOS transistor 116 are connected to the upper plate of the first capacitor 117, and the terminal is defined as the output terminal VO of the AND summing operational circuit. The source of the MOS transistor 113 is connected to the drain of the MOS transistor 114. The source of the MOS transistor 114 and the drain of the MOS transistor 115 are connected to the upper plate of the second capacitor 118. The source of the MOS transistor 115 is connected to the lower plate of the second capacitor 118 to connect with the power supply VDD. The source of the MOS transistor 116 is connected to the lower plate of the first capacitor 117 to the ground. The gate of the MOS transistor 111 is connected to the output terminal of a first inverter 119, the gate of the MOS transistor 112 is connected to the output terminal of a second inverter 1110, the input terminal of the first inverter 119 is connected to the input data signal $x_i$, the input terminal of the second inverter 1110 is connected to the input data signal $w_i$, and the high level and low level thereof correspond to values 1 and 0. The gate of the MOS transistor 113 is connected to a clear signal CLR, the gate of the MOS transistor 114 is connected to a bias voltage VBIAS, the gate of the MOS transistor 115 is connected to a precharge signal CHARGE, and the gate of the MOS transistor 116 is connected to a reset signal RESET.

Example 2

In this embodiment, the logical operation implemented by the logic operational circuit is the NAND summing operation (NAND logical operation summation), the logic operational circuit is the NAND summing operational circuit, and the logic operational channel is the NAND summing operational channel. The data to be logically operated includes the data signal $x_i$ and the weight signal $w_i$, in which i=1, 2, . . . , N, and N is the total quantity of the data signals or the weight signals.

The control unit is used to input the data signal $x_i$ and the weight signal $w_i$ into the NAND summing operational channel when performing the NAND summing operation. Before each group of $x_i$ and $w_i$ is input, the first MOS transistor is controlled to be turned off and the third MOS transistor is turned on to charge the second capacitor to the voltage VDD, then the first MOS transistor is controlled to be turned on and the third MOS transistor is turned off, and then $x_i$ and $w_i$ are input into the NAND summing operational channel.

The NAND summing operational channel is used to connect the drain terminal of the first MOS transistor to the output terminal VO after receiving inputs of $x_i$ and $w_i$ when one of $x_i$ and $w_i$ is low level to perform voltage superposition on the output terminal VO, and not connect the drain terminal of the first MOS transistor to the output terminal VO when both $x_i$ and $w_i$ are not low level to no longer perform voltage superposition on the output terminal VO. The gate of the second MOS transistor is connected with the bias voltage to ensure that the voltage superimposed each time is of the same amount. The final voltage value of the output terminal VO is the voltage value corresponding to the NAND summing operation result $$\sum_{i=1}^{N} \overline{w_i \ \& \ x_i}.$$

Specifically, there are various ways to implement the NAND summing operational channel.

In an optional implementation, the NAND summing operational channels includes a fourth MOS transistor and a fifth MOS transistor. The source of the fourth MOS transistor and the source of the fifth MOS transistor are jointly connected to the drain of the first MOS transistor, and the drain of the fourth MOS transistor and the drain of the fifth MOS transistor are jointly connected to the output terminal VO. The gate of the fourth MOS transistor is connected with $w_i$, and the gate of the fifth MOS transistor is connected with $x_i$. If the fourth MOS transistor is a PMOS transistor, then the gate thereof is connected with $w_i$; and if the fourth MOS transistor is an NMOS transistor, then the gate thereof is connected with the inverting signal of $w_i$. If the fifth MOS transistor is a PMOS transistor, then the gate thereof is connected with $x_i$; and if the fifth MOS transistor is an NMOS transistor, then the gate thereof is connected with the inverting signal of $x_i$.

In another optional implementation, the NAND summing operational channel includes a fourth MOS transistor, a fifth MOS transistor, a sixth MOS transistor, a seventh MOS transistor, an eighth MOS transistor, and a ninth MOS transistor. The source of the fourth MOS transistor, the source of the sixth MOS transistor, and the source of the eighth MOS transistor are jointly connected to the drain of the first MOS transistor. The drain of the fourth MOS transistor is connected to the source of the fifth MOS transistor. The drain of the sixth MOS transistor is connected to the source of the seventh MOS transistor. The drain of the eighth MOS transistor is connected to the source of the ninth MOS transistor. The source of the fifth MOS transistor, the source of the seventh MOS transistor, and the source of the ninth MOS transistor are jointly connected to the output terminal VO. If the fifth MOS transistor is a PMOS transistor, then the gate thereof is connected with $w_i$; and if the fifth MOS transistor is an NMOS transistor, then the gate thereof is connected with the inverting signal of $w_i$. If the ninth MOS transistor is a PMOS transistor, then the gate thereof is connected with $w_i$; and if the ninth MOS transistor is an NMOS transistor, then the gate thereof is connected with the inverting signal of $w_i$. If the fourth MOS transistor is a PMOS transistor, then the gate thereof is connected with $x_i$; and if the fourth MOS transistor is an NMOS transistor, then the gate thereof is connected with the inverting signal of $x_i$. If the sixth MOS transistor is a PMOS transistor, then the gate thereof is connected with $x_i$; and if the sixth MOS transistor is an NMOS transistor, then the gate thereof is connected with the inverting signal of $x_i$. If the seventh MOS transistor is a PMOS transistor, then the gate thereof is connected with $w_i$; and if the seventh MOS transistor is an NMOS transistor, then the gate thereof is connected with the inverting signal of $w_i$. If the eighth MOS transistor is a PMOS transistor, then the gate thereof is connected with $x_i$; and if the eighth MOS transistor is an NMOS transistor, then the gate thereof is connected with the inverting signal of $x_i$.

It should be noted that the input positions of $x_i$ and $w_i$ mentioned above may be interchanged, and the disclosure is not limited thereto.

Figure 3:
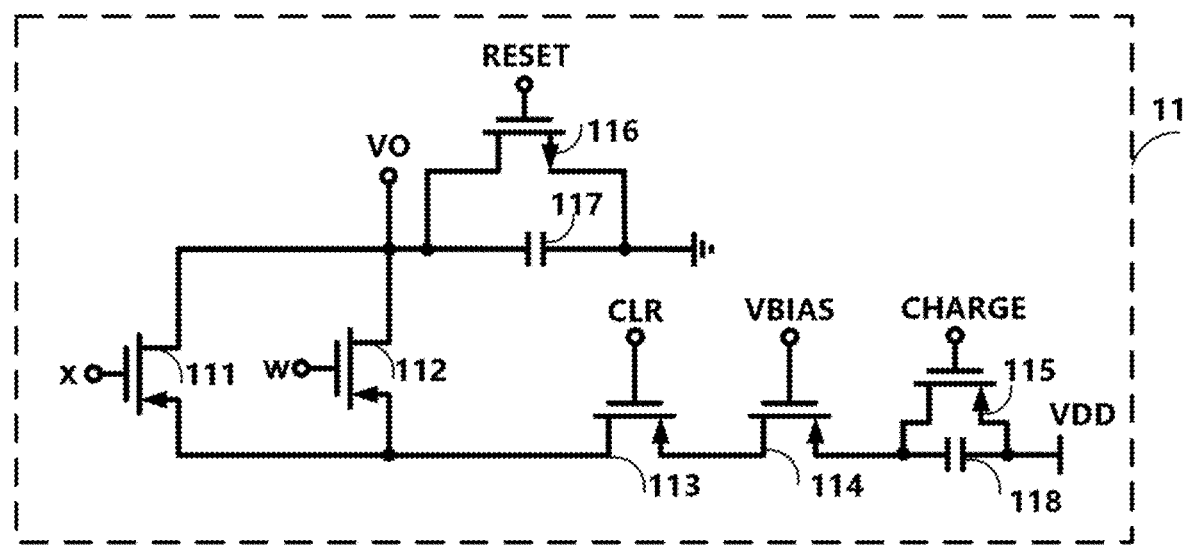
FIG. 3 is a schematic structural diagram of an NAND summing operational circuit provided in Example 2 of the disclosure.

The following is a detailed description of an implementation. Specifically, FIG. 3 shows the first specific implementation of the DAC-based NAND summing operational circuit according to the disclosure. In this embodiment, a DAC-based NAND summing operational circuit 11 includes 6 MOS transistors (111, 112, 113, 114, 115, and 116), two capacitors (117 and 118), and two inverting logic circuits (119 and 1110). The MOS transistors 113, 114, and 115 are respectively the first to third MOS transistors, the MOS transistors 111 and 112 are respectively the fourth and fifth MOS transistors, and the MOS transistor 116 is the MOS transistor C. Specifically, the source of the MOS transistor 111, the source of the MOS transistor 112, and the drain of the MOS transistor 113 are connected. The drain of the MOS transistor 111, the drain of the MOS transistor 112, and the drain of the MOS transistor 116 are connected to the upper plate of the first capacitor 117, and the terminal is defined as the output terminal VO of the CICU. The source of the MOS transistor 113 is connected to the drain of the MOS transistor 114. The source of the MOS transistor 114 and the drain of the MOS transistor 115 are connected to the upper plate of the second capacitor 118. The source of the MOS transistor 115 is connected to the lower plate of the second capacitor 118 to connect with the power supply VDD. The source of the MOS transistor 116 is connected to the lower plate of the first capacitor 117 to the ground. The gate of the MOS transistor 111 is connected to the input data signal $x_i$, the gate of the MOS transistor 112 is connected to the input data signal $w_i$, and the high level and low level thereof correspond to values 1 and 0. The gate of the MOS transistor 113 is connected to the clear signal CLR, the gate of the MOS transistor 114 is connected to the bias voltage VBIAS, the gate of the MOS transistor 115 is connected to the precharge signal CHARGE, and the gate of the MOS transistor 116 is connected to the reset signal RESET.

The working principles of the circuits in FIG. 2 and FIG. 3 are explained in detail. When the RESET signal is high level, the CLR signal is high level, and the CHARGE signal is high level, the MOS transistor 116 is turned on to the ground, the output terminal of the circuit is reset to low level, the gate of the MOS transistor 113 is high level, the MOS transistor 113 is turned off, and the circuit stops working. When the RESET signal is low level, the MOS transistor 116 is turned off, and the circuit is in the working state. At this time, when the CHARGE signal is low level and the CLR signal is high level, the circuit works in the precharge state, the MOS transistor 113 is turned off, the MOS transistor 115 is turned on, and the upper plate of the second capacitor 118 is charged to the VDD level. When the CHARGE signal is high level and the CLR signal is low level, the MOS transistor 113 is turned on, and the MOS transistor 115 is turned off. At this time, related description is as follows.

For the circuit in FIG. 2 implementing the AND summing operation, at this time, the first inverter 119 and the second inverter 1110 output inverting signals according to the value of the input data. As an example, the signals $x_i$ and $w_i$ corresponding to the input data are both high level. The output terminals of the first inverter 119 and the second inverter 1110 are low level, the gates of the MOS transistor 111 and the MOS transistor 112 are both low level, and the MOS transistor 111 and the MOS transistor 112 are turned on. At this time, the charge on the upper plate of the second capacitor 118 is discharged to the upper plate of the first capacitor 117 through the channel formed by the MOS transistor 114, the MOS transistor 113, the MOS transistor 112, and the MOS transistor 111. By setting the bias voltage value, the conduction degree of the MOS transistor 114 may be adjusted, the value of the discharge current of the second capacitor 118 may be controlled, and thereby a voltage $\Delta V$ of a fixed amount is established at the output terminal of the circuit within a unit time. If one of the two input data signals is a high level and the other is a low level, or if both signals are low level, then the CICU 11 circuit does not inject charge into the output terminal. Thereafter, taking N circuit working cycles as an example, according to the AND summing operation result of the input data, a value of 1 corresponds to a high-level signal, and a value of 0 corresponds to a low-level signal. If the AND summing operation result of the input data is 1, then the voltage $\Delta V$ is superimposed to the output terminal of the circuit; and if the AND summing operation result of the input data is 0, then the output terminal voltage of the circuit remains unchanged. After N circuit working cycles, assuming that the quantity of cycles of the AND summing operation result of the data being 1 is q, then the output voltage of the circuit is: $V_O = q\Delta V$.

For the circuit in FIG. 3 implementing the NAND summing operation, as an example, the signal $x_i$ corresponding to the input data is low level and $w_i$ is high level. The gate of the MOS transistor 111 is low level, the gate of the MOS transistor 112 is high level, the MOS transistor 111 is turned on, and the MOS transistor 112 is turned off. At this time, the charge on the upper plate of the second capacitor 118 is discharged to the upper plate of the first capacitor 117 through the channel formed by the MOS transistor 114, the MOS transistor 113, and the MOS transistor 111. By setting the bias voltage value, the conduction degree of the MOS transistor 114 may be adjusted, the value of the discharge current of the second capacitor 118 may be controlled, and thereby a voltage ΔV of a fixed amount is established at the output terminal of the circuit within a unit time. In the same way, if the signal $x_i$ corresponding to the input data is high level and $w_i$ is low level, or if both signals are low level, then the circuit injects charge into the output terminal; if both input data signals are high level, then the circuit does not inject charge into the output terminal. Thereafter, taking N circuit working cycles as an example, according to the NAND summing operation result of the input data, a value of 1 corresponds to a high-level signal, and a value of 0 corresponds to a low-level signal. If the NAND summing operation result of the input data is 1, then the voltage ΔV is superimposed to the output terminal of the circuit; and if the NAND summing operation result of the input data is 0, then the output terminal voltage of the circuit remains unchanged. After N circuit working cycles, assuming that the quantity of cycles of the NAND summing operation result of the data being 1 is q, then the output voltage of the circuit is: $V_O = q\Delta V$.

Example 3

In this embodiment, the logical operation implemented by the logic operational circuit is the OR summing operation (OR logical operation summation), the logic operational circuit is the OR summing operational circuit, and the logic operational channel is the OR summing operational channel. The data to be logically operated includes the data signal $x_i$ and the weight signal $w_i$, in which i=1,2, ..., N, and N is the total quantity of the data signals or the weight signals.

The control unit is used to input the data signal $x_i$ and the weight signal $w_i$ into the OR summing operational channel when performing the OR summing operation. Before each group of $x_i$ and $w_i$ is input, the first MOS transistor is controlled to be turned off and the third MOS transistor is turned on to charge the second capacitor to the voltage VDD, then the first MOS transistor is controlled to be turned on, the third MOS transistor is turned off and $x_i$ and $w_i$ are input into the OR summing operational channel.

The OR summing operational channel is used to connect the drain terminal of the first MOS transistor to the output terminal VO after receiving inputs of $x_i$ and $w_i$ when one of $x_i$ and $w_i$ is high level to perform voltage superposition on the output terminal VO, and not connect the drain terminal of the first MOS transistor to the output terminal VO when both $x_i$ and $w_i$ are not high level to no longer perform voltage superposition on the output terminal VO. The gate of the second MOS transistor is connected with the bias voltage to ensure that the voltage superimposed each time is of the same amount. The final voltage value of the output terminal VO is the voltage value corresponding to the OR summing operation result $$\sum_{i=1}^{N} w_i | x_i.$$

Specifically, there are various ways to implement the OR summing operational channel.

In an optional implementation, the OR summing operational channels includes a fourth MOS transistor and a fifth MOS transistor. The source of the fourth MOS transistor and the source of the fifth MOS transistor are jointly connected to the drain of the first MOS transistor, and the drain of the fourth MOS transistor and the drain of the fifth MOS transistor are jointly connected to the output terminal VO. If the fourth MOS transistor is a PMOS transistor, then the gate thereof is connected with the inverting signal of $x_i$; and if the fourth MOS transistor is an NMOS transistor, then the gate thereof is connected with $x_i$. If the fifth MOS transistor is a PMOS transistor, then the gate thereof is connected with the inverting signal of $w_i$; and if the fifth MOS transistor is an NMOS transistor, then the gate thereof is connected with $w_i$.

In another optional implementation, the OR summing operational channel includes a fourth MOS transistor, a fifth MOS transistor, a sixth MOS transistor, a seventh MOS transistor, an eighth MOS transistor, and a ninth MOS transistor. The source of the fourth MOS transistor, the source of the sixth MOS transistor, and the source of the eighth MOS transistor are jointly connected to the drain of the first MOS transistor. The drain of the fourth MOS transistor is connected to the source of the fifth MOS transistor. The drain of the sixth MOS transistor is connected to the source of the seventh MOS transistor. The drain of the eighth MOS transistor is connected to the source of the ninth MOS transistor. The source of the fifth MOS transistor, the source of the seventh MOS transistor, and the source of the ninth MOS transistor are jointly connected to the output terminal VO. If the seventh MOS transistor is a PMOS transistor, then the gate thereof is connected with $w_i$; and if the seventh MOS transistor is an NMOS transistor, then the gate thereof is connected with the inverting signal of $w_i$. If the eighth MOS transistor is a PMOS transistor, then the gate thereof is connected with $x_i$; and if the eighth MOS transistor is an NMOS transistor, then the gate thereof is connected with the inverting signal of $x_i$. If the fifth MOS transistor is a PMOS transistor, then the gate thereof is connected with $w_i$; and if the fifth MOS transistor is an NMOS transistor, then the gate thereof is connected with the inverting signal of $w_i$. If the ninth MOS transistor is a PMOS transistor, then the gate thereof is connected with the inverting signal of $w_i$; and if the ninth MOS transistor is an NMOS transistor, then the gate thereof is connected with the inverting signal of $w_i$. If the fourth MOS transistor is a PMOS transistor, then the gate thereof is connected with $x_i$; and if the fourth MOS transistor is an NMOS transistor, then the gate thereof is connected with the inverting signal of $x_i$. If the sixth MOS transistor is a PMOS transistor, then the gate thereof is connected with $x_i$; and if the sixth MOS transistor is an NMOS transistor, then the gate thereof is connected with the inverting signal of $x_i$.

It should be noted that the input positions of $x_i$ and $w_i$ mentioned above may be interchanged, and the disclosure is not limited thereto.

Figure 4:
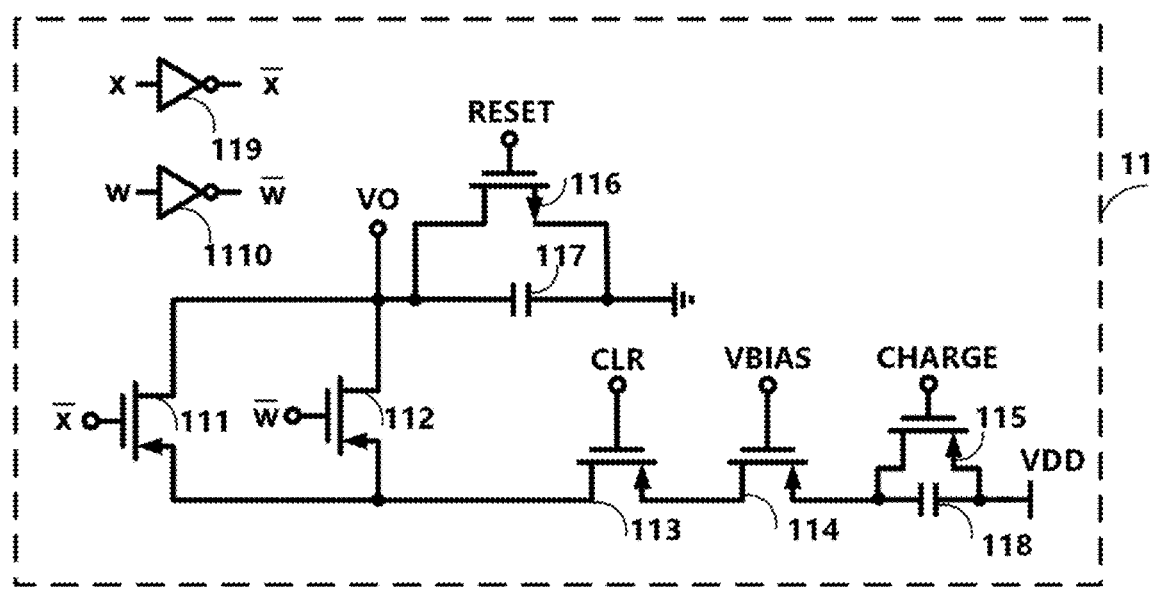
FIG. 4 is a schematic structural diagram of an OR summing operational circuit provided in Example 3 of the disclosure.

The following is a detailed description of an implementation. FIG. 4 shows a specific implementation of the DAC-based OR summing operational circuit according to the disclosure. In this embodiment, a DAC-based OR summing operational circuit 11 includes 6 MOS transistors (111, 112, 113, 114, 115, and 116), two capacitors (117 and 118), and two inverting logic circuits (119 and 1110). The MOS transistors 113, 114, and 115 are respectively the first to third MOS transistors, the MOS transistors 111 and 112 are respectively the fourth and fifth MOS transistors, and the MOS transistor 116 is the MOS transistor C. Specifically, the source of the MOS transistor 111, the source of the MOS transistor 112, and the drain of the MOS transistor 113 are connected; and the drain of the MOS transistor 111, the drain of the MOS transistor 112, and the drain of the MOS transistor 116 are connected to the upper plate of the first capacitor 117, and the terminal is defined as the output terminal VO of the circuit. The source of the MOS transistor 113 is connected to the drain of the MOS transistor 114. The source of the MOS transistor 114 and the drain of the MOS transistor 115 are connected to the upper plate of the second capacitor 118. The source of the MOS transistor 115 is connected to the lower plate of the second capacitor 118 to connect with the power supply VDD. The source of the MOS transistor 116 is connected to the lower plate of the first capacitor 117 to the ground. The gate of the MOS transistor 111 is connected to the output terminal of the first inverter 119, the gate of the MOS transistor 112 is connected to the output terminal of the second inverter 1110, the input terminal of the first inverter 119 is connected to the input data signal $x_i$, the input terminal of the second inverter 1110 is connected to the input data signal $w_i$, and the high level and low level thereof correspond to values 1 and 0. The gate of the MOS transistor 113 is connected to the clear signal CLR, the gate of the MOS transistor 114 is connected to the bias voltage VBIAS, the gate of the MOS transistor 115 is connected to the precharge signal CHARGE, and the gate of the MOS transistor 116 is connected to the reset signal RESET.

Example 4

In this embodiment, the logical operation implemented by the logic operational circuit is the NOR summing operation (NOR logical operation summation), the logic operational circuit is the NOR summing operational circuit, and the logic operational channel is the NOR summing operational channel. The data to be logically operated includes the data signal $x_i$ and the weight signal $w_i$, in which i=1,2, ... , N, and N is the total quantity of the data signals or the weight signals.

The control unit is used to input the data signal $x_i$ and the weight signal $w_i$ into the NOR summing operational channel when performing the NOR summing operation. Before each group of $x_i$ and $w_i$ is input, the first MOS transistor is controlled to be turned off and the third MOS transistor is turned on to charge the second capacitor to the voltage VDD, then the first MOS transistor is controlled to be turned on, the third MOS transistor is turned off and $x_i$ and $w_i$ are input into the NOR summing operational channel.

The NOR summing operational channel is used to connect the drain terminal of the first MOS transistor to the output terminal VO after receiving inputs of $x_i$ and $w_i$ when $x_i$ and $w_i$ are both low level to perform voltage superposition on the output terminal VO, and not connect the drain terminal of the first MOS transistor to the output terminal VO when $x_i$ and $w_i$ are not both low level to no longer perform voltage superposition on the output terminal VO. The gate of the second MOS transistor is connected with the bias voltage to ensure that the voltage superimposed each time is of the same amount. The final voltage value of the output terminal VO is the voltage value corresponding to the NOR summing operation result $$\sum_{i=1}^{N} \overline{w_i | x_i}.$$

Specifically, there are various ways to implement the NOR summing operational channel.

In an optional implementation, the NOR summing operational channel includes a fourth MOS transistor and a fifth MOS transistor. The source of the fourth MOS transistor is connected to the drain of the fifth MOS transistor, and the drain of the fourth MOS transistor is connected to the output terminal VO. The source of the fifth MOS transistor is connected to the drain of the first MOS transistor. If the fourth MOS transistor is a PMOS transistor, then the gate thereof is connected with $w_i$; and if the fourth MOS transistor is an NMOS transistor, then the gate thereof is connected with the inverting signal of $w_i$. If the fifth MOS transistor is a PMOS transistor, then the gate thereof is connected with $x_i$; and if the fifth MOS transistor is an NMOS transistor, then the gate thereof is connected with the inverting signal of $x_i$.

In another optional implementation, the NOR summing operational channel includes a fourth MOS transistor, a fifth MOS transistor, a sixth MOS transistor, and a seventh MOS transistor. The drain of the fourth MOS transistor is connected to the output terminal VO, and the source of the fourth MOS transistor is connected to the drain of the fifth MOS transistor. The source of the fifth MOS transistor is connected to the drain of the sixth MOS transistor. The source of the sixth MOS transistor is connected to the drain of the seventh MOS transistor. The source of the seventh MOS transistor is connected to the drain of the first MOS transistor. If the fourth MOS transistor is a PMOS transistor, then the gate thereof is connected with $w_i$; and if the fourth MOS transistor is an NMOS transistor, then the gate thereof is connected with the inverting signal of $w_i$. If the fifth MOS transistor is a PMOS transistor, then the gate thereof is connected with $w_i$; and if the fifth MOS transistor is an NMOS transistor, then the gate thereof is connected with the inverting signal of $w_i$. If the sixth MOS transistor is a PMOS transistor, then the gate thereof is connected with $x_i$; and if the sixth MOS transistor is an NMOS transistor, then the gate thereof is connected with the inverting signal of $x_i$. If the seventh MOS transistor is a PMOS transistor, then the gate thereof is connected with $x_i$; and if the seventh MOS transistor is an NMOS transistor, then the gate thereof is connected with the inverting signal of $x_i$.

It should be noted that the input positions of $x_i$ and $w_i$ mentioned above may be interchanged, and the disclosure is not limited thereto.

Figure 5:
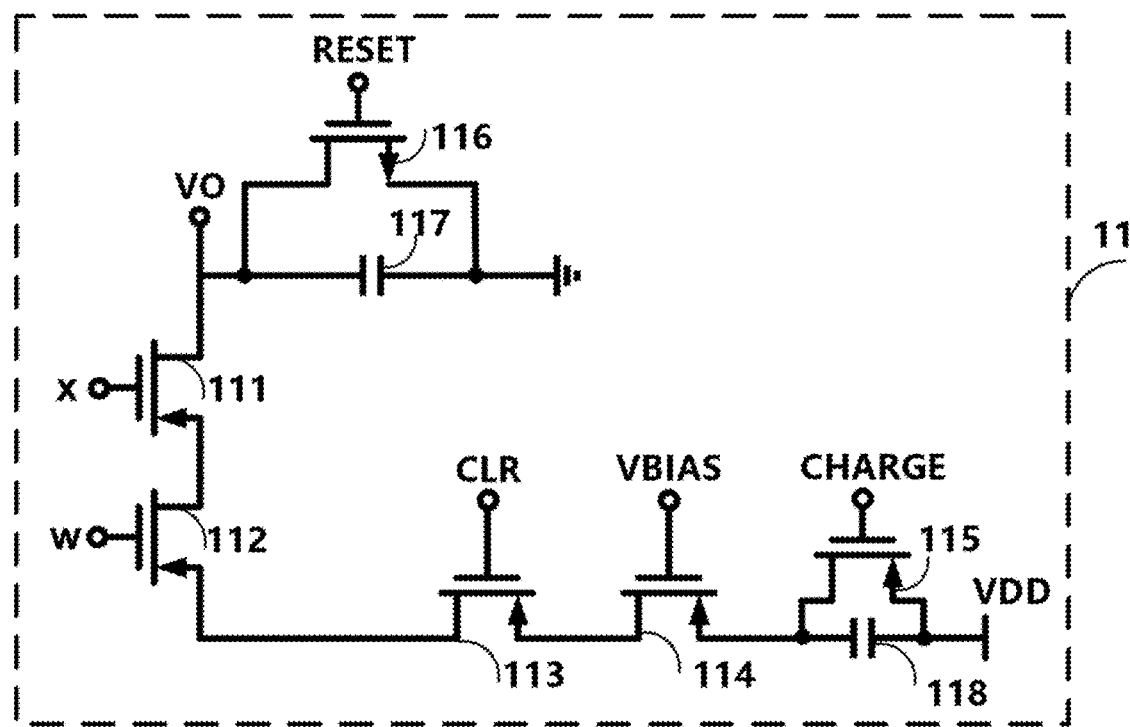
FIG. 5 is a schematic structural diagram of an NOR summing operational circuit provided in Example 4 of the disclosure.

The following is a detailed description of an implementation. FIG. 5 shows a specific implementation of the DAC-based NOR summing operational circuit according to the disclosure. A DAC-based NOR summing operational circuit 11 includes 6 MOS transistors (111, 112, 113, 114, 115, and 116) and two capacitors (117 and 118). The MOS transistors 113, 114, and 115 are respectively the first to third MOS transistors, the MOS transistors 111 and 112 are respectively the fourth and fifth MOS transistors, and the MOS transistor 116 is the MOS transistor C. Specifically, the source of the MOS transistor 112 is connected to the drain of the MOS transistor 113; the source of the MOS transistor 111 is connected to the drain of the MOS transistor 112; and the drain of the MOS transistor 111 and the drain of the MOS transistor 116 are connected to the upper plate of the first capacitor 117, and the terminal is defined as the output terminal VO of the circuit. The source of the MOS transistor 113 is connected to the drain of the MOS transistor 114. The source of the MOS transistor 114 and the drain of the MOS transistor 115 are connected to the upper plate of the second capacitor 118. The source of the MOS transistor 115 is connected to the lower plate of the second capacitor 118 to connect with the power supply VDD. The source of the MOS transistor 116 is connected to the lower plate of the first capacitor 117 to the ground. The gate of the MOS transistor 111 is connected to the input data signal $x_i$, the gate of the MOS transistor 112 is connected to the input data signal $w_i$, and the high level and low level thereof correspond to values 1 and 0. The gate of the MOS transistor 113 is connected to the clear signal CLR, the gate of the MOS transistor 114 is connected to the bias voltage VBIAS, the gate of the MOS transistor 115 is connected to the precharge signal CHARGE, and the gate of the MOS transistor 116 is connected to the reset signal RESET.

The working principles of the circuits in FIG. 4 and FIG. 5 are explained in detail. As shown in FIG. 4 and FIG. 5, when the RESET signal is high level, the CLR signal is high level, and the CHARGE signal is high level, the MOS transistor 116 is turned on to the ground, the output terminal of the circuit is reset to low level, the gate of the MOS transistor 113 is high level, the MOS transistor 113 is turned off, and the circuit stops working. When the RESET signal is low level, the MOS transistor 116 is turned off, and the circuit is in the working state. At this time, when the CHARGE signal is low level and the CLR signal is high level, the circuit works in the precharge state, the MOS transistor 113 is turned off, the MOS transistor 115 is turned on, and the upper plate of the second capacitor 118 is charged to the VDD level. When the CHARGE signal is high level and the CLR signal is low level, the MOS transistor 113 is turned on, and the MOS transistor 115 is turned off. At this time, related description is as follows.

For the CICU 11 circuit implementing the OR summing operation, at this time, the first inverter 119 and the second inverter 1110 output inverting signals according to the value of the input data. As an example, the signal $x_i$ corresponding to the input data is high level, and $w_i$ is low level. The output of the first inverter 119 is low level, the output terminal of the second inverter 1110 is high level, the gate of the MOS transistor 111 is low level, the gate of the MOS transistor 112 is high level, the MOS transistor 111 is turned on, and the MOS transistor 112 is turned off. At this time, the charge on the upper plate of the second capacitor 118 is discharged to the upper plate of the first capacitor 117 through the channel formed by the MOS transistor 114, the MOS transistor 113, and the MOS transistor 111. By setting the bias voltage value, the conduction degree of the MOS transistor 114 may be adjusted, the value of the discharge current of the second capacitor 118 may be controlled, and thereby a voltage ΔV of a fixed amount is established at the output terminal of the circuit within a unit time. In the same way, if the signal $x_i$ corresponding to the input data is high level and $w_i$ is low level, or if both signals are high level, then the CICU 11 circuit injects charge into the output terminal; and if the input data are all low level, then the circuit does not inject charge into the output terminal. Thereafter, taking N circuit working cycles as an example, according to the OR summing operation result of the input data, a value of 1 corresponds to a high-level signal, and a value of 0 corresponds to a low-level signal. If the OR summing operation result of the input data is 1, then the voltage ΔV is superimposed to the output terminal of the circuit; and if the OR summing operation result of the input data is 0, then the output terminal voltage of the circuit remains unchanged. After N circuit working cycles, assuming that the quantity of cycles of the OR summing operation result of the data being 1 is q, then the output voltage of the circuit is: $V_O = q\Delta V$.

For the circuit implementing the NOR summing operation, as an example, the signal $x_i$ and $w_i$ corresponding to the input data are both low levels. The gate of the MOS transistor 111 and the gate of the MOS transistor 112 are both low levels, and the MOS transistor 111 and the MOS transistor 112 are turned on. At this time, the charge on the upper plate of the second capacitor 118 is discharged to the upper plate of the first capacitor 117 through the channel formed by the MOS transistor 114, the MOS transistor 113, the MOS transistor 112, and the MOS transistor 111. By setting the bias voltage value, the conduction degree of the MOS transistor 114 may be adjusted, the value of the discharge current of the second capacitor 118 may be controlled, and thereby a voltage ΔV of a fixed amount is established at the output terminal of the CICU 11 circuit within a unit time. If one of the input data signals is low level and the other is high level, or if both signals are high level, then the circuit does not inject charge into the output terminal. Thereafter, taking N circuit working cycles as an example, according to the result of the NOR summing operation of the input data, a value of 1 corresponds to a high-level signal, and a value of 0 corresponds to a low-level signal. If the NOR summing operation result of the input data is 1, then the voltage ΔV is superimposed to the output terminal of the circuit; and if the NOR summing operation result of the input data is 0, then the output terminal voltage of the circuit remains unchanged. After N circuit working cycles, assuming that the quantity of cycles of the NOR summing operation result of the data being 1 is q, then the output voltage of the CICU 11 circuit is: $V_O = q\Delta V$.

Example 5

In this embodiment, the logical operation implemented by the logic operational circuit is the NOT summing operation (NOT logical operation summation), the logic operational circuit is the NOT summing operational circuit, and the logic operational channel is the NOT summing operational channel. The data to be logically operated includes the data signal $x_i$ and the weight signal $w_i$, in which i=1,2, . . . , N, and N is the total quantity of the data signals or the weight signals.

The control unit is used to input the data signal $x_i$ and the weight signal $w_i$ into the NOT summing operational channel when performing the NOT summing operation. Before each group of $x_i$ and $w_i$ is input, the first MOS transistor is controlled to be turned off and the third MOS transistor is turned on to charge the second capacitor to the voltage VDD, then the first MOS transistor is controlled to be turned on, the third MOS transistor is turned off and $x_i$ and $w_i$ are input into the AND summing operational channel.

The NOT summing operational channel is used to connect the drain terminal of the first MOS transistor to the output terminal VO after receiving input of $x_i$ when $x_i$ is low level to perform voltage superposition on the output terminal VO, and not connect the drain terminal of the first MOS transistor to the output terminal VO when $x_i$ is not low level to no longer perform voltage superposition on the output terminal VO. The gate of the second MOS transistor is connected with the bias voltage to ensure that the voltage superimposed each time is of the same amount. The final voltage value of the output terminal VO is the voltage value corresponding to the NOT summing operation result $$\sum_{i=1}^{N} \overline{x_i}.$$

Specifically, there are various ways to implement the NOT summing operational channel.

In an optional implementation, the NOT summing operational channel includes a fourth MOS transistor. The source of the fourth MOS transistor is connected to the drain of the first MOS transistor, and the drain of the fourth MOS transistor is connected to the output terminal VO. If the fourth MOS transistor is a PMOS transistor, then the gate thereof is connected with $x_i$; and if the fourth MOS transistor is an NMOS transistor, then the gate thereof is connected with the inverting signal of $x_i$.

In another optional implementation, the NOT summing operational channel includes a fourth MOS transistor and a fifth MOS transistor. The source of the fourth MOS transistor is connected to the drain of the first MOS transistor, the drain of the fourth MOS transistor is connected to the source of the fifth MOS transistor, and the drain of the fifth MOS transistor is connected to the output terminal VO. If the fourth MOS transistor is a PMOS transistor, then the gate thereof is connected with $x_i$; and if the fourth MOS transistor is an NMOS transistor, then the gate thereof is connected with the inverting signal of $x_i$. If the fifth MOS transistor is a PMOS transistor, then the gate thereof is connected with $x_i$; and if the fifth MOS transistor is an NMOS transistor, then the gate thereof is connected with the inverting signal of $x_i$.

Figure 6:
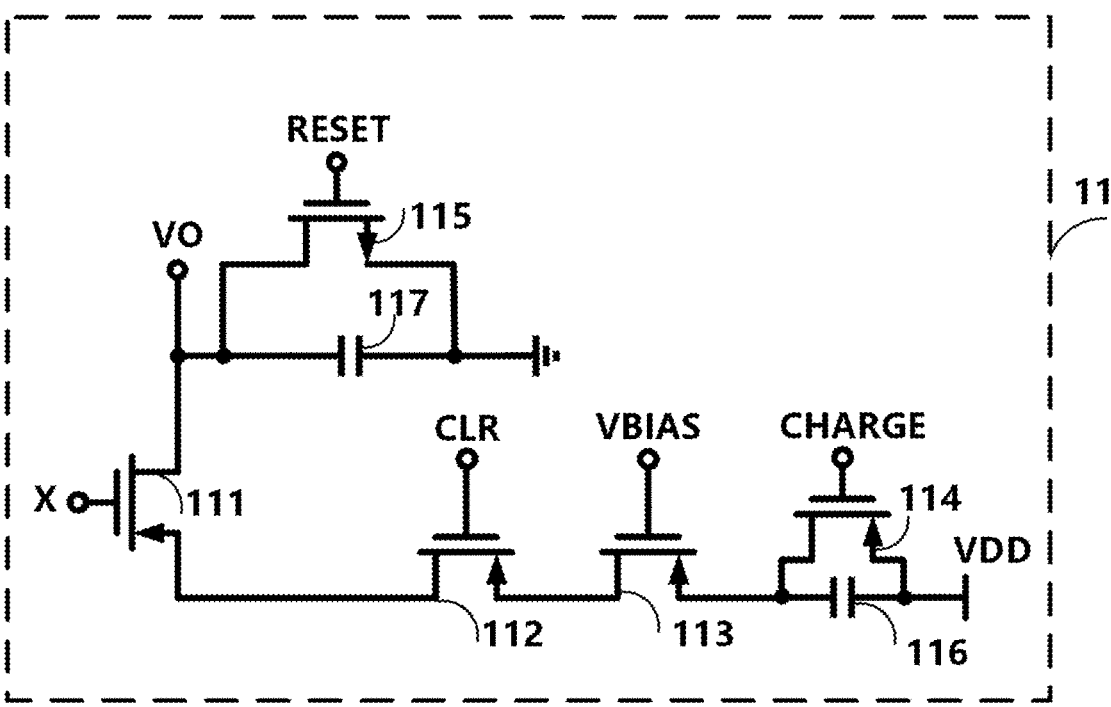
FIG. 6 is a schematic structural diagram of an NOT summing operational circuit provided in Example 5 of the disclosure.

The following is a detailed description of an implementation. Specifically, FIG. 6 shows an implementation of the DAC-based NOT summing operational circuit according to the disclosure. In this embodiment, a DAC-based NOT summing operational circuit 11 includes five MOS transistors (111, 112, 113, 114, and 115) and two capacitors (116 and 117). The MOS transistors 112, 113, and 114 are the first to third MOS transistors respectively, the MOS transistor 111 is the fourth MOS transistor, and the MOS transistor 115 is the MOS transistor C. Specifically, the source of the MOS transistor 111 is connected to the drain of the MOS transistor 112. The drain of the MOS transistor 111 and the drain of the MOS transistor 115 are connected to the upper plate of the first capacitor 117, and the terminal is defined as the output terminal VO of the circuit. The source of the MOS transistor 112 is connected to the drain of the MOS transistor 113. The source of the MOS transistor 113 and the drain of the MOS transistor 114 are connected to the upper plate of second capacitor 116. The source of the MOS transistor 114 is connected to the lower plate of the second capacitor 116 to connect with the power supply VDD. The source of the MOS transistor 115 is connected to the lower plate of the first capacitor 117 to the ground. The gate of the MOS transistor 111 is connected to the input data signal $x_i$, and the high level and low level thereof correspond to values 1 and 0. The gate of the MOS transistor 112 is connected to the clear signal CLR, the gate of the MOS transistor 113 is connected to the bias voltage VBIAS, the gate of the MOS transistor 114 is connected to the precharge signal CHARGE, and the gate of the MOS transistor 115 is connected to the reset signal RESET.

The working principle of the circuit in FIG. 6 is explained in detail. As shown in FIG. 6, when the RESET signal is high level, the CLR signal is high level, and the CHARGE signal is high level, the MOS transistor 115 is turned on to the ground, the output terminal of the circuit is reset to low level, the gate of the MOS transistor 112 is high level, the MOS transistor 112 is turned off, and the circuit stops working. When the RESET signal is low level, the MOS transistor 115 is turned off, and the circuit is in the working state. At this time, when the CHARGE signal is low level and the CLR signal is high level, the circuit works in the precharge state, the MOS transistor 112 is turned off, the MOS transistor 114 is turned on, and the upper plate of the second capacitor 116 is charged to the VDD level.

When the CHARGE signal is high level and the CLR signal is low level, the MOS transistor 112 is turned on, and the MOS transistor 114 is turned off. At this time, according to the value of the input data, related description is as follows. As an example, the signal $x_i$ corresponding to the input data is low level. The gate of the MOS transistor 111 is low level and the MOS transistor 111 is turned on. At this time, the charge on the upper plate of the second capacitor 116 is discharged to the upper plate of the first capacitor 117 through the channel formed by the MOS transistor 113, the MOS transistor 112, and the MOS transistor 111. By setting the bias voltage value, the conduction degree of the MOS transistor 113 may be adjusted, and the value of the discharge current of the second capacitor 116 may be controlled, thereby a voltage $\Delta V$ of a fixed amount is established at the output terminal of the circuit within a unit time. If the signal corresponding to the input data is high level, then the circuit does not inject charge into the output terminal. Thereafter, taking N circuit working cycles as an example, according to the NOT summing operation result of the input data, a value of 1 corresponds to a high-level signal, and a value of 0 corresponds to a low-level signal. If the NOT summing operation result of the input data is 1, then the voltage $\Delta V$ is superimposed to the output terminal of the circuit; and if the NOT summing operation result of the input data is 0, then the output terminal voltage of the circuit remains unchanged. After N circuit working cycles, assuming that the quantity of cycles the NOT summing operation of the data being 1 is q, then the output voltage of the circuit is: $V_O = q\Delta V$.

Example 6

In this embodiment, the logical operation implemented by the logic operational circuit is the XNOR summing operation (XNOR logical operation summation), the logic operational circuit is the XNOR summing operational circuit, and the logic operational channel is the XNOR summing operational channel. The data to be logically operated includes the data signal $x_i$ and the weight signal $w_i$, in which i=1, 2, . . . , N, and N is the total quantity of the data signals or the weight signals.

The control unit is used to input the data signal $x_i$ and the weight signal $w_i$ into the XNOR summing operational channel when performing the XNOR summing operation. Before each group of $x_i$ and $w_i$ is input, the first MOS transistor is controlled to be turned off and the third MOS transistor is turned on to charge the second capacitor to the voltage VDD, then the first MOS transistor is controlled to be turned on, the third MOS transistor is turned off and $x_i$ and $w_i$ are input into the XNOR summing operational channel.

The XNOR summing operational channel is used to connect the drain terminal of the first MOS transistor to the output terminal VO after receiving inputs of $x_i$ and $w_i$ when $x_i$ and $w_i$ are of the same level to perform voltage superposition on the output terminal VO, and not connect the drain terminal of the first MOS transistor to the output terminal VO when $x_i$ and $w_i$ are not of the same level to no longer perform voltage superposition on the output terminal VO. The gate of the second MOS transistor is connected with the bias voltage to ensure that the voltage superimposed each time is of the same amount. The final voltage value of the output terminal VO is the voltage value corresponding to the XNOR summing operation result $$\sum_{i=1}^{N} w_i \odot x_i.$$

Specifically, there are various ways to implement the XNOR summing operational channel.

In an optional implementation, the XNOR summing operational channel includes a fourth MOS transistor, a fifth MOS transistor, a sixth MOS transistor, and a seventh MOS transistor. The source of the fourth MOS transistor is connected to the drain of the fifth MOS transistor, and the source of the sixth MOS transistor is connected to the drain of the seventh MOS transistor. The drain of the fourth MOS transistor is connected to the drain of the sixth MOS transistor to connect with the output terminal VO. The source of the fifth MOS transistor and the source of the seventh MOS transistor are connected to the drain of the first MOS transistor. If the fourth MOS transistor is a PMOS transistor, then the gate thereof is connected with $x_i$; and if the fourth MOS transistor is an NMOS transistor, then the gate thereof is connected with the inverting signal of $x_i$. If the fifth MOS transistor is a PMOS transistor, then the gate thereof is connected with $w_i$; and if the fifth MOS transistor is an NMOS transistor, then the gate thereof is connected with the inverting signal of $w_i$. If the sixth MOS transistor is a PMOS transistor, then the gate thereof is connected with the inverting signal of $x_i$; and if the sixth MOS transistor is an NMOS transistor, then the gate thereof is connected with $x_i$. If the seventh MOS transistor is a PMOS transistor, then the gate thereof is connected with the inverting signal of $w_i$; and if the seventh MOS transistor is an NMOS transistor, then the gate thereof is connected with $w_i$.

In another optional implementation, the XNOR summing operational channel includes a fourth MOS transistor, a fifth MOS transistor, a sixth MOS transistor, and a seventh MOS transistor. The source of the fourth MOS transistor, the drain of the fifth MOS transistor, the source of the sixth MOS transistor, and the drain of the seventh MOS transistor are connected. The drain of the fourth MOS transistor is connected to the drain of the sixth MOS transistor to connect with the output terminal VO. The source of the fifth MOS transistor and the source of the seventh MOS transistor are connected to the drain of the first MOS transistor. If the fourth MOS transistor is a PMOS transistor, then the gate thereof is connected with $x_i$; and if the fourth MOS transistor is an NMOS transistor, then the gate thereof is connected with the inverting signal of $x_i$. If the fifth MOS transistor is a PMOS transistor, then the gate thereof is connected with the inverting signal of $w_i$; and if the fifth MOS transistor is an NMOS transistor, then the gate thereof is connected with $w_i$. If the sixth MOS transistor is a PMOS transistor, then the gate thereof is connected with the inverting signal of $x_i$; and if the sixth MOS transistor is an NMOS transistor, then the gate thereof is connected with $x_i$. If the seventh MOS transistor is a PMOS transistor, then the gate thereof is connected with $w_i$; and if the seventh MOS transistor is an NMOS transistor, then the gate thereof is connected with the inverting signal of $w_i$.

It should be noted that the input positions of $x_i$ and $w_i$ mentioned above may be interchanged, and the disclosure is not limited thereto.

Figure 7:
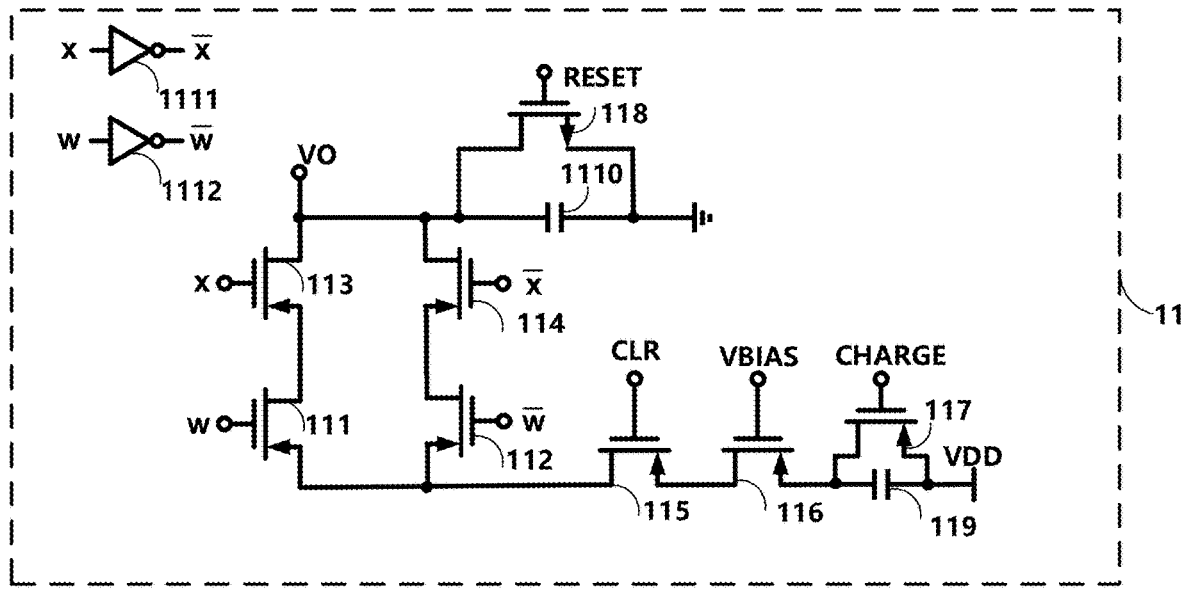
FIG. 7 is a schematic structural diagram of an XNOR summing operational circuit provided in Example 6 of the disclosure.

The following is a detailed description of an implementation. Specifically, FIG. 7 shows a specific implementation of the DAC-based XNOR summing operational circuit according to the disclosure. In this embodiment, a DAC-based XNOR summing operational circuit 11 includes 8 MOS transistors (111, 112, 113, 114, 115, 116, 117, and 118), two capacitors (119 and 1110), and two inverting logic circuits (1111 and 1112). The MOS transistors 115, 116, and 117 are respectively the first to third MOS transistors, the MOS transistors 111, 113, 112, and 114 are respectively the fourth and seventh MOS transistors, and the MOS transistor 118 is the MOS transistor C. Specifically, the source of the MOS transistor 111, the source of the MOS transistor 112, and the drain of the MOS transistor 115 are connected. The source of the MOS transistor 113 is connected to the drain of the MOS transistor 111, and the source of the MOS transistor 114 is connected to the drain of the MOS transistor 112. The drain of the MOS transistor 113, the drain of the MOS transistor 114, and the drain of MOS transistor 118 are connected to the upper plate of the first capacitor 1110, and the terminal is defined as the output terminal VO of the circuit. The source of the MOS transistor 115 is connected to the drain of the MOS transistor 116. The source of the MOS transistor 116 and the drain of the MOS transistor 117 are connected to the upper plate of the second capacitor 119, and the source of the MOS transistor 117 is connected to the lower plate of the second capacitor 119 to connect with the power supply VDD. The source of the MOS transistor 118 is connected to the lower plate of the first capacitor 1110 to the ground. The gate of the MOS transistor 114 is connected to the output terminal of the first inverter 1111, the gate of the MOS transistor 112 is connected to the output terminal of the second inverter 1112, the gate of the MOS transistor 111 is connected to the weight signal $w_i$, the gate of the MOS transistor 113 is connected to the data signal $x_i$, the input terminal of the first inverter 1111 is connected to the input data signal $x_i$, the input terminal of the second inverter 1112 is connected to the weight signal $w_i$, and the high level and low level thereof correspond to values 1 and 0. The gate of the MOS transistor 115 is connected to the clear signal CLR, the gate of the MOS transistor 116 is connected to the bias voltage VBIAS, the gate of the MOS transistor 117 is connected to the precharge signal CHARGE, and the gate of the MOS transistor 118 is connected to the reset signal RESET.

Example 7

In this embodiment, the logical operation implemented by the logic operational circuit is the XOR summing operation (XOR logical operation summation), the logic operational circuit is the XOR summing operational circuit, and the logic operational channel is the XOR summing operational channel. The data to be logically operated includes the data signal $x_i$ and the weight signal $w_i$, in which i=1,2, ..., N, and N is the total quantity of the data signals or the weight signals.

The control unit is used to input the data signal $x_i$ and the weight signal $w_i$ into the XOR summing operational channel when performing the XOR summing operation. Before each group of $x_i$ and $w_i$ is input, the first MOS transistor is controlled to be turned off and the third MOS transistor is turned on to charge the second capacitor to the voltage VDD, then the first MOS transistor is controlled to be turned on, the third MOS transistor is turned off and $x_i$ and $w_i$ are input into the XOR summing operational channel.

The XOR summing operational channel is used to connect the drain terminal of the first MOS transistor to the output terminal VO after receiving inputs of $x_i$ and $w_i$ when $x_i$ and $w_i$ are not of the same level to perform voltage superposition on the output terminal VO, and not connect the drain terminal of the first MOS transistor to the output terminal VO when $x_i$ and $w_i$ are of the same level to no longer performed voltage superposition on the output terminal VO. The gate of the second MOS transistor is connected with the bias voltage to ensure that the voltage superimposed each time is of the same amount. The final voltage value of the output terminal VO is the voltage value corresponding to the XOR summing operation result $$\sum_{i=1}^{N} w_i \oplus x_i.$$

Specifically, there are various ways to implement the XOR and summing operational channel.

In an optional implementation, the XOR summing operational channel includes a fourth MOS transistor, a fifth MOS transistor, a sixth MOS transistor, and a seventh MOS transistor. The source of the fourth MOS transistor is connected to the drain of the fifth MOS transistor, and the source of the sixth MOS transistor is connected to the drain of the seventh MOS transistor. The drain of the fourth MOS transistor is connected to the drain of the sixth MOS transistor to connect with the output terminal VO. The source of the fifth MOS transistor and the source of the seventh MOS transistor are connected to the drain of the first MOS transistor. If the fourth MOS transistor is a PMOS transistor, then the gate thereof is connected with the inverting signal of $x_i$; and if the fourth MOS transistor is an NMOS transistor, then the gate thereof is connected with $x_i$. If the fifth MOS transistor is a PMOS transistor, then the gate thereof is connected with $w_i$; and if the fifth MOS transistor is an NMOS transistor, then the gate thereof is connected with the inverting signal of $w_i$. If the sixth MOS transistor is a PMOS transistor, then the gate thereof is connected with $x_i$; and if the sixth MOS transistor is an NMOS transistor, then the gate thereof is connected with the inverting signal of $x_i$. If the seventh MOS transistor is a PMOS transistor, then the gate thereof is connected with the inverting signal of $w_i$; and if the seventh MOS transistor is an NMOS transistor, then the gate thereof is connected with $w_i$.

In another optional implementation, the XOR summing operational channel includes a fourth MOS transistor, a fifth MOS transistor, a sixth MOS transistor, and a seventh MOS transistor. The source of the fourth MOS transistor, the drain of the fifth MOS transistor, the source of the sixth MOS transistor, and the drain of the seventh MOS transistor are connected. The drain of the fourth MOS transistor is connected to the drain of the sixth MOS transistor to connect with the output terminal VO. The source of the fifth MOS transistor and the source of the seventh MOS transistor are connected to the drain of the first MOS transistor.

If the fourth MOS transistor is a PMOS transistor, then the gate thereof is connected with the inverting signal of $x_i$; and if the fourth MOS transistor is an NMOS transistor, then the gate thereof is connected with $x_i$. If the fifth MOS transistor is a PMOS transistor, then the gate thereof is connected with the inverting signal of $w_i$; and if the fifth MOS transistor is an NMOS transistor, then the gate thereof is connected with $w_i$. If the sixth MOS transistor is a PMOS transistor, then the gate thereof is connected with $x_i$; and if the sixth MOS transistor is an NMOS transistor, then the gate thereof is connected with the inverting signal of $x_i$. If the seventh MOS transistor is a PMOS transistor, then the gate thereof is connected with $w_i$; and if the seventh MOS transistor is an NMOS transistor, then the gate thereof is connected with the inverting signal of $w_i$.

It should be noted that the input positions of $x_i$ and $w_i$ mentioned above may be interchanged, and the disclosure is not limited thereto.

Figure 8:
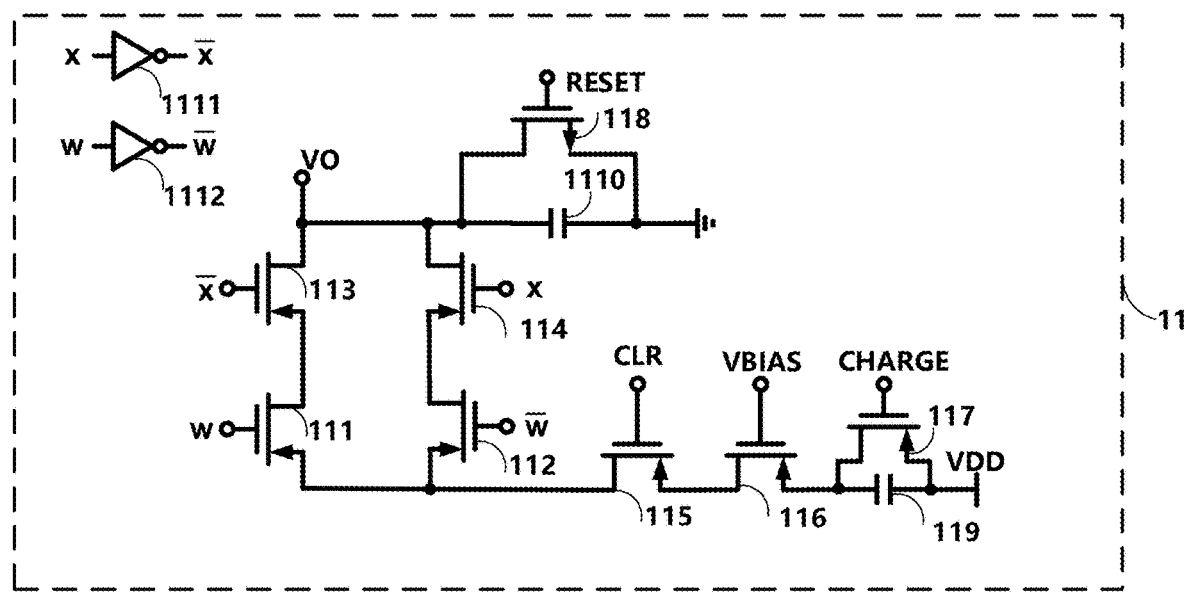
FIG. 8 is a schematic structural diagram of an XOR summing operational circuit provided in Example 7 of the disclosure.

The following is a detailed description of an implementation. Specifically, FIG. 8 shows a specific implementation of the DAC-based XOR summing operational circuit according to the disclosure. In this embodiment, a DAC-based XOR summing operational circuit 11 includes 8 MOS transistors (111, 112, 113, 114, 115, 116, 117, and 118), two capacitors (119 and 1110), and two inverting logic circuits (1111 and 1112). The MOS transistors 115, 116, and 117 are respectively the first to third MOS transistors, the MOS transistors 111, 113, 112, and 114 are respectively the fourth to the seventh MOS transistors, and the MOS transistor 118 is the MOS transistor C. Specifically, the source of the MOS transistor 111, the source of the MOS transistor 112, and the drain of the MOS transistor 115 are connected. The source of the MOS transistor 113 is connected to the drain of the MOS transistor 111, and the source of the MOS transistor 114 is connected to the drain of the MOS transistor 112. The drain of the MOS transistor 113, the drain of the MOS transistor 114, and the drain of the MOS transistor 118 are connected to the upper plate of the first capacitor 1110, and the terminal is defined as the output terminal VO of the circuit. The source of the MOS transistor 115 is connected to the drain of the MOS transistor 116. The source of the MOS transistor 116 and the drain of the MOS transistor 117 are connected to the upper plate of the second capacitor 119. The source of the MOS transistor 117 is connected to the lower plate of the second capacitor 119 to connect with the power supply VDD, and the source of the MOS transistor 118 is connected to the lower plate of the first capacitor 1110 to the ground. The gate of the MOS transistor 113 is connected to the output terminal of the first inverter 1111, the gate of the MOS transistor 112 is connected to the output terminal of the second inverter 1112, the gate of the MOS transistor 111 is connected to the weight signal $w_i$, the gate of the MOS transistor 114 is connected to the data signal $x_i$, the input terminal of the first inverter 1111 is connected to the input data signal $x_i$, the input terminal of the second inverter 1112 is connected to the input data signal $w_i$, and the high level and low level correspond to values 1 and 0. The gate of the MOS transistor 115 is connected to the clear signal CLR, the gate of the MOS transistor 116 is connected to the bias voltage VBIAS, the gate of the MOS transistor 117 is connected to the precharge signal CHARGE, and the gate of the MOS transistor 118 is connected to the reset signal RESET.

The working principles of the circuits in FIG. 7 and FIG. 8 are explained in detail. As shown in FIG. 7 and FIG. 8, when the RESET signal is high level, the CLR signal is high level, and the CHARGE signal is high level, the MOS transistor 118 is turned on to the ground, the output terminal of the circuit is reset to low level, the gate of the MOS transistor 115 is high level, the MOS transistor 115 is turned off, and the circuit stops working. When the RESET signal is low level, the MOS transistor 118 is turned off, and the circuit is in the working state. At this time, when the CHARGE signal is low level and the CLR signal is high level, the circuit works in the precharge state, the MOS transistor 115 is turned off, the MOS transistor 117 is turned on, and the upper plate of the second capacitor 119 is charged to the VDD level. When the CHARGE signal is high level and the CLR signal is low level, the MOS transistor 115 is turned on, and the MOS transistor 117 is turned off. At this time, related description is as follows.

For the circuit in FIG. 7 implementing the XNOR summing operation, at this time, the first inverter 1111 and the second inverter 1112 output inverting signals according to the value of the input data. As an example, the input data signal and the weight signal are both high levels. The output of the first inverter 1111 is low level, the output terminal of the second inverter 1112 is low level, the gate of the MOS transistor 111 is high level, the gate of the MOS transistor 113 is high level, the gate of the MOS transistor 112 is low level, the gate of the MOS transistor 114 is low level, the MOS transistor 111 and the MOS transistor 113 are turned off, and the MOS transistor 112 and the MOS transistor 114 are turned on. At this time, the charge on the upper plate of the second capacitor 119 is discharged to the upper plate of the first capacitor 1110 through the channel formed by the MOS transistor 116, the MOS transistor 115, the MOS transistor 112, and the MOS transistor 114. By setting the bias voltage value, the conduction degree of the MOS transistor 116 may be adjusted, the value of the discharge current of the second capacitor 119 may be controlled, and thereby a voltage ΔV of a fixed amount is established at the output terminal of the circuit within a unit time. In the same way, if the signal $x_i$ corresponding to the input data is low level and $w_i$ is low level, then the circuit injects charge into the output terminal. If the input data and the weight signal are not the same, then the circuit does not inject charge into the output terminal. Thereafter, taking N circuit working cycles as an example, according to the XNOR summing operation result of the input data, a value of 1 corresponds to a high-level signal, and a value of 0 corresponds to a low-level signal. If the XNOR summing operation result of the input data is 1, then the voltage ΔV is superimposed to the output terminal of the circuit; and if the XNOR summing operation result of the input data is 0, then the output terminal voltage of the circuit remains unchanged. After N circuit working cycles, assuming that the quantity of cycles of the XNOR summing operation result of the data being 1 is q, then the output voltage of the circuit is: $V_O = q\Delta V$.

For the circuit in FIG. 8 implementing the XOR summing operation, at this time, the first inverter 1111 and the second inverter 1112 output inverting signals according to the value of the input data. As an example, the input data signal is high level and the input weight signal is low level. The output of the first inverter 1111 is low level, the output terminal of the second inverter 1112 is high level, the gate of the MOS transistor 111 is low level, the gate of the MOS transistor 113 is low level, the gate of the MOS transistor 112 is high level, the gate of the MOS transistor 114 is high level, the MOS transistor 111 and the MOS transistor 113 are turned on, and the MOS transistor 112 and the MOS transistor 114 are turned off. At this time, the charge on the upper plate of the second capacitor 119 is discharged to the upper plate of the first capacitor 1110 through the channel formed by the MOS transistor 116, the MOS transistor 115, the MOS transistor 111, and the MOS transistor 113. By setting the bias voltage value, the conduction degree of the MOS transistor 116 may be adjusted, the value of the discharge current of the second capacitor 119 may be controlled, and thereby a voltage ΔV of a fixed amount is established at the output terminal of the circuit within a unit time. In the same way, if the signal $x_i$ corresponding to the input data is low level and $w_i$ is high level, then the circuit injects charge into the output terminal. If the input data and the weight signal are the same, then the circuit does not inject charge into the output terminal. Thereafter, taking N circuit working cycles as an example, according to the XOR summing operation result of the input data, a value of 1 corresponds to a high-level signal, and a value of 0 corresponds to a low-level signal. If the result of the XOR summing operation of the input data is 1, then the voltage ΔV is superimposed to the output terminal of the circuit; and if the XOR summing operation result of the input data is 0, then the output terminal voltage of the circuit remains unchanged. After N circuit working cycles, assuming that the quantity of cycles of the XOR summing operation result of the data being 1 is q, then the output voltage of the circuit is: $V_O = q\Delta V$.

In the second aspect, the disclosure provides a mixed-signal convolution operational circuit, which is a DAC-based convolution operational circuit (denoted as a CICU circuit) to realize the multiply-accumulate operation (convolution operation) of the input data and weight, and the circuit includes a first MOS transistor, a second MOS transistor, a third MOS transistor, a first capacitor, a second capacitor, a third capacitor, an arithmetic operational channel, and a control unit.

A terminal of the first capacitor serves as a non-inverting output terminal VP of the convolution operational circuit, and the other terminal is connected to the ground. A terminal of the second capacitor serves as an inverting output terminal VN of the convolution operational circuit, and the other terminal is connected to the ground. The source of the first MOS transistor is connected to the drain of the second MOS transistor. The source of the second MOS transistor, the drain of the third MOS transistor, and a terminal of the third capacitor are connected. The source of the third MOS transistor is connected to the other terminal of the third capacitor to connect with the power supply voltage VDD.

The control unit is used to input the data signal $x_i$ and the weight signal $w_i$ into the arithmetic operational channel when performing binary convolution operations. When each set of $x_i$ and $w_i$ is input, the first MOS transistor is controlled to be turned off and the third MOS transistor is turned on to charge the third capacitor to the voltage VDD, and then the first MOS transistor is controlled to be turned on and the third MOS transistor is turned off. According to the input conditions of $x_i$ and $w_i$, charge injection is performed. i=1, 2, ..., N; and N is the length of data to be convolved.

The arithmetic operational channel is used to connect the drain terminal of the first MOS transistor to the non-inverting output terminal VP after receiving inputs of $x_i$ and $w_i$ when $x_i$ and $w_i$ are of the same level to perform voltage superposition on the non-inverting output terminal VP, and connect the drain terminal of the first MOS transistor to the inverting output terminal VN when $x_i$ and $w_i$ are of opposite levels to perform voltage superposition on the inverting output terminal VN. The gate of the second MOS transistor is connected with a preset bias voltage to ensure that the voltage superimposed each time is of the same amount.

A final voltage difference between the non-inverting output terminal VP and the inverting output terminal VN is the voltage value corresponding to the convolution operation result $$\sum_{i=1}^{N} w_i x_i.$$

In the formula, $w_i$ is a high-level signal or a low-level signal; $x_i$ is a high-level signal or a low-level signal; and the high-level signal corresponds to the value 1, and the low-level signal corresponds to the value −1.

The specific operation process is as follows. When the multiplication result of the two input values is 1, the DAC-based convolution operational circuit selects the positive charge injection channel from the third capacitor to the first capacitor, and after completing one charge injection, a voltage of a certain value is superimposed to the non-inverting output terminal VP. When the multiplication result of the two input values is −1, the DAC-based convolution operational circuit selects the inverting charge injection channel from the third capacitor to the second capacitor, and after completing one charge injection, a voltage of a certain value is superimposed to the inverting output terminal VN. Taking the above working process as a cycle, the DAC-based convolution operational circuit may establish an analog voltage value related to the multiply-accumulate operation result at the differential output terminal through a successive injection process based on the product result of the input value.

Preferably, the control unit is further used to input a clear signal to the gate of the first MOS transistor to control the switching state of the first MOS transistor, and to input a precharge signal to the gate of the third MOS transistor to control the switching state of the third MOS transistor.

Preferably, the convolution operational circuit further includes a MOS transistor A and a MOS transistor B. The drain of the MOS transistor A is connected to the non-inverting output terminal VP, and the source is connected to the ground. The drain of the MOS transistor B is connected to the inverting output terminal VN, and the source is connected to the ground.

The control unit is further used to reset the convolution operational circuit before performing the binary convolution operation, in which the MOS transistor A and the MOS transistor B are controlled to be turned on, and the first MOS transistor and the third MOS transistor are turned off, so as to reset the non-inverting output terminal VP and the inverting output terminal VN to the ground. When performing the convolution operation, the MOS transistor A and the MOS transistor B are controlled to be turned off.

In an optional implementation, the arithmetic operational channel includes fourth to eleventh MOS transistors. The source of the fourth MOS transistor, the source of the fifth MOS transistor, the source of the eighth MOS transistor, and the source of the ninth MOS transistor are jointly connected to the drain of the first MOS transistor. The drain of the fourth MOS transistor is connected to the source of the sixth MOS transistor; the drain of the fifth MOS transistor is connected to the source of the seventh MOS transistor; the drain of the eighth MOS transistor is connected to the source of the tenth MOS transistor; the drain of the ninth MOS transistor is connected to the source of the eleventh MOS transistor; the drain of the sixth MOS transistor and the drain of the tenth MOS transistor are jointly connected to the non-inverting output terminal VP; the drain of the seventh MOS transistor and the drain of the eleventh MOS transistor are jointly connected to the inverting output terminal VN; the gate of the fourth MOS transistor and the gate of the fifth MOS transistor are connected to $w_i$; the gate of the sixth MOS transistor and the gate of the eleventh MOS transistor are connected to $x_i$; the gate of the seventh MOS transistor and the gate of the tenth MOS transistor are connected to the inverting signal of $x_i$; and the gate of the eighth MOS transistor and the gate of the ninth MOS transistor are connected to the inverting signal of $w_i$.

In another optional implementation, the arithmetic operational channel includes fourth to eleventh MOS transistors. The source of the fourth MOS transistor, the source of the fifth MOS transistor, the source of the eighth MOS transistor, and the source of the ninth MOS transistor are jointly connected to the drain of the first MOS transistor; the drain of the fourth MOS transistor, the source of the sixth MOS transistor, the drain of the eighth MOS transistor, and the source of the tenth MOS transistor are connected; the drain of the fifth MOS transistor, the source of the seventh MOS transistor, the drain of the ninth MOS transistor, and the source of the eleventh MOS transistor are connected; the drain of the sixth MOS transistor and the drain of the tenth MOS transistor are jointly connected to the non-inverting output terminal VP; the drain of the seventh MOS transistor and the drain of the eleventh MOS transistor are jointly connected to the inverting output terminal VN; the gate of the fourth MOS transistor and the gate of the fifth MOS transistor are connected to $w_i$; the gate of the seventh MOS transistor and the gate of the tenth MOS transistor are connected to $x_i$; the gate of the sixth MOS transistor and the gate of the eleventh MOS transistor are connected to the inverting signal of $x_i$; and the gate of the eighth MOS transistor and the gate of the ninth MOS transistor are connected to the inverting signal of $w_i$.

Detailed description is provided below with reference to a specific embodiment.

Example 8

Figure 9:
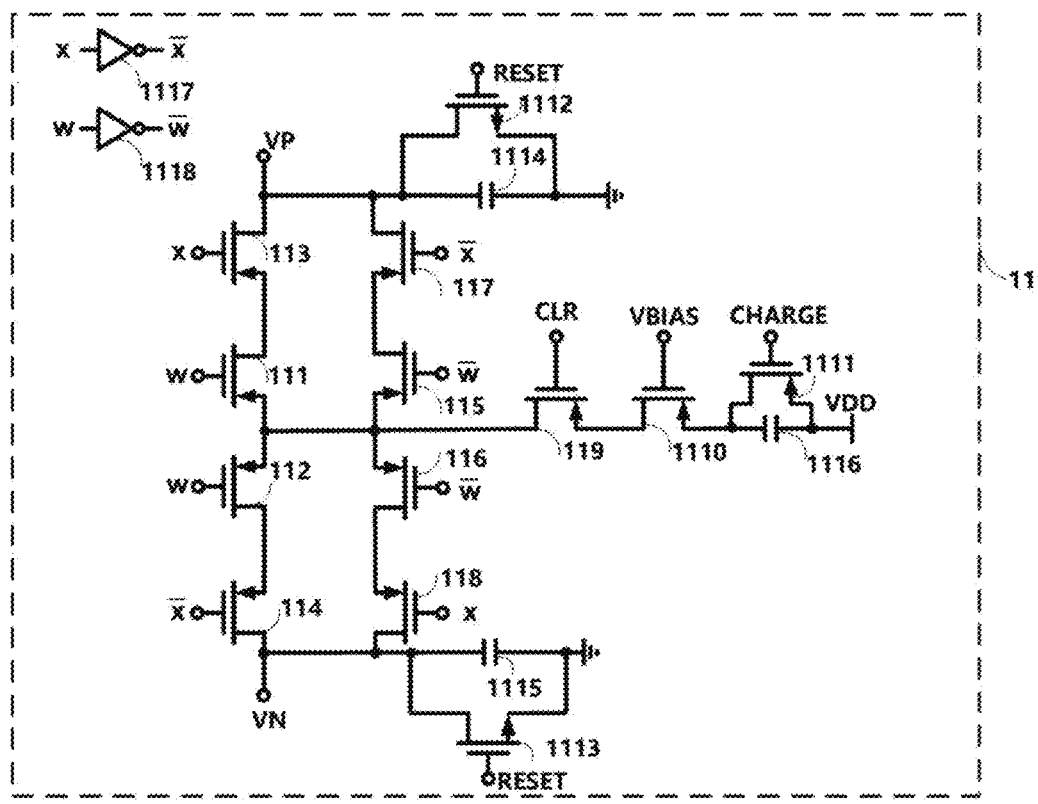
FIG. 9 is a schematic structural diagram of a convolution operational circuit provided in Example 8 of the disclosure.

FIG. 9 shows the DAC-based convolution operational circuit disclosed in this embodiment. In this embodiment, a DAC-based convolution operational circuit 11 includes 13 MOS transistors (111, 112, 113, 114, 115, 116, 117, 118, 119, 1110, 1111, 1112, and 1113), three capacitors (1114, 1115, and 1116), and two inverting logic circuits (1117 and 1118). The MOS transistors 119, 1110, and 1111 are respectively the first to third MOS transistors, the MOS transistors 111, 112, 113, 114, 115, 116, 117, and 118 are respectively the fourth to eleventh MOS transistors, and the MOS transistors 1112 and 1113 are the MOS transistor A and the MOS transistor B respectively. Specifically, the source of the MOS transistor 111, the source of the MOS transistor 112, the source of the MOS transistor 115, the source of the MOS transistor 116, and the drain of the MOS transistor 119 are connected; the drain of the MOS transistor 111 is connected to the source of the MOS transistor 113; the drain of the MOS transistor 112 is connected to the source of the MOS transistor 114; the drain of the MOS transistor 115 is connected to the source of the MOS transistor 117; the drain of the MOS transistor 116 is connected to the source of the MOS transistor 118; the drain of the MOS transistor 113, the drain of the MOS transistor 117, and the drain of the MOS transistor 1112 are connected to the upper plate of the first capacitor 1114, and the terminal is defined as the non-inverting output terminal VP of CICU; the drain of the fourth MOS transistor 114, the drain of the eighth MOS transistor 118, and the drain of the MOS transistor 1113 are connected to the upper plate of the second capacitor 1115, and the terminal is defined as the inverting output terminal VN of the CICU; the source of the MOS transistor 119 is connected to the drain of the MOS transistor 1110; the source of the MOS transistor 1110 and the drain of the MOS transistor 1111 are connected to the upper plate of the third capacitor 1116; the source of the MOS transistor 1111 is connected to the lower plate of the third capacitor 1116 to connect with the power supply VDD, the source of the MOS transistor 1112 is connected to the lower plate of the first capacitor 1114 to the ground; the source of the MOS transistor 1113 is connected to the lower plate of the third capacitor 1115 to the ground;

the gate of the MOS transistor 113 and the gate of the MOS transistor 118 are connected to the input data signal $x_i$, and the high level and low level thereof correspond to values 1 and −1; the gate of the MOS transistor 111 and the gate of the MOS transistor 112 are connected to the input weight signal $w_i$, and the high level and low level thereof correspond to values 1 and −1; the gate of the MOS transistor 114 and the gate of the MOS transistor 117 are connected to the output terminal of the first inverter 1117; the gate of the MOS transistor 115 and the gate of the MOS transistor 116 are connected to the output terminal of the second inverter 1118; the input terminal of the first inverter 1117 is connected to the input data signal $x_i$; and the input terminal of the second inverter 1118 is connected to the input weight signal $w_i$. The gate of the MOS transistor 119 is connected to the clear signal CLR, the gate of the MOS transistor 1110 is connected to the bias voltage VBIAS, the gate of the MOS transistor 1111 is connected to the precharge signal CHARGE, and the gate of the MOS transistor 1112 and the gate of the MOS transistor 1113 are connected to the reset signal RESET.

The working principle of the CICU 11 circuit is explained in detail. As shown in FIG. 9, when the RESET signal is high level, the CLR signal is high level, and the CHARGE signal is high level, the MOS transistor 1112 and the MOS transistor 1113 are turned on to the ground, the positive and inverting output terminals of CICU 11 are reset to low level, the gate of the MOS transistor 119 is high level, the MOS transistor 119 is turned off, and the CICU 11 circuit stops working. When the RESET signal is low level, the MOS transistor 1112 and the MOS transistor 1113 are turned off, and the CICU 11 circuit is in the working state. At this time, when the CHARGE signal is low level and the CLR signal is high level, CICU 11 works in the precharge state, the MOS transistor 119 is turned off, the MOS transistor 1111 is turned on, and the upper plate of the third capacitor 1116 is charged to the VDD level.

When the CHARGE signal is high level and the CLR signal is low level, the MOS transistor 119 is turned on, and the MOS transistor 1111 is turned off. At this time, the inverter circuit 1117 and the second inverter 1118 output inverting signals according to the values of the input data and the input weight. As an example, the signal $x_i$ corresponding to the input data and the signal $w_i$ corresponding to the input weight are of the same level. When $x_i$ and $w_i$ are both low level, the gate of the MOS transistor 111 and the gate of the MOS transistor 113 are both low level, and the MOS transistor 111 and the MOS transistor 113 are turned on. At this time, the charge on the upper plate of the third capacitor 1116 is discharged to the upper plate of the first capacitor 1114 through the channel formed by the MOS transistor 1110, the MOS transistor 119, the MOS transistor 111, and the MOS transistor 113. When $x_i$ and $w_i$ are both high level, the output terminal of the first inverter 1117 and the output terminal of the second inverter 1118 are low level, the gate of the MOS transistor 115 and the gate of the MOS transistor 117 are low level, and the MOS transistor 115 and the MOS transistor 117 are turned on. At this time, the charge on the upper plate of the third capacitor 1116 is discharged to the upper plate of the first capacitor 1114 through the channel formed by the MOS transistor 1110, the MOS transistor 119, the MOS transistor 115, and the MOS transistor 117. By setting the bias voltage value, the conduction degree of the MOS transistor 1110 may be adjusted, the value of the discharge current of the third capacitor 116 may be controlled, and thereby a voltage $\Delta V$ of a fixed amount is established at the non-inverting output terminal of the CICU 11 circuit within a unit time. In the same way, when the input data $x_i$ and the weight value $w_i$ are not of the same level, the inverting output terminal of the CICU 11 circuit establishes a voltage $\Delta V$ of a fixed amount. Thereafter, taking N circuit working cycles as an example, according to the numerical product of the input data and the weight, a value of 1 corresponds to a high-level signal, and a value of −1 corresponds to a low-level signal. If the numerical product of the input data and the weight is 1, that is, the levels of the data signal $x_i$ and the weight signal $w_i$ are the same, then the voltage $\Delta V$ is superimposed to the non-inverting output terminal of the CICU 11 circuit; and if the numerical product of the input data and the weight is −1, that is, the levels of the data signal $x_i$ and the weight signal $w_i$ are opposite, then the voltage $\Delta V$ is superimposed to the inverting output terminal of the CICU 11 circuit. After N circuit working cycles, assuming that the quantity of cycles in which the product of data and weight is 1 is q, then the output voltage of the positive terminal of the CICU circuit is: $V_P = q\Delta V$; the output voltage of the inverting terminal of the CICU 11 circuit is: $V_N = (N-q)\Delta V$; the differential output voltage of the CICU 11 circuit is:

$$V_P - V_N = \sum_{i=1}^{N} w_i x_i \Delta V;$$

and the differential voltage value corresponds to the multiply-accumulate operation result of the input data $x=[x_i, x_2, \ldots, x_N]$ and the weight $w=[w_i, w_2, \ldots, w_N]$.

It should be noted that in addition to adjusting the amount of the preset bias voltage, the value of the voltage $\Delta V$ may also be adjusted by adjusting the pulse width of the CLR signal and/or CHARGE signal. In addition, the voltage may also be adjusted by adjusting the amount of capacitance of the first capacitor and/or the second capacitor.

Example 9

Figure 10:
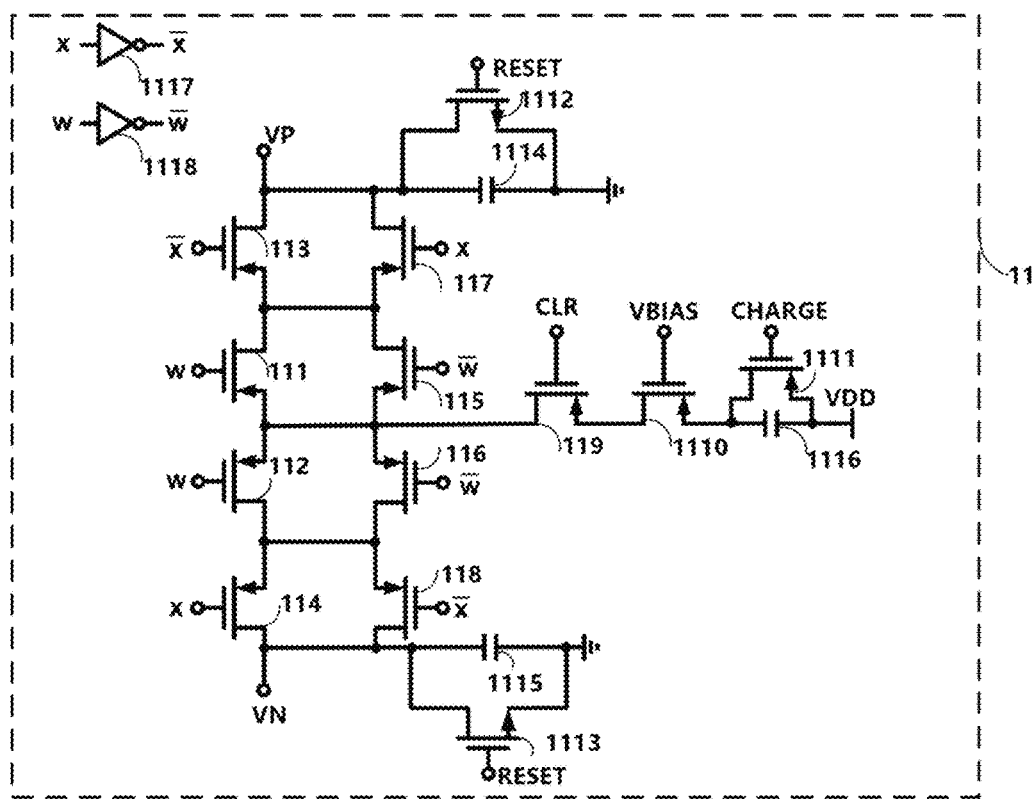
FIG. 10 is a schematic structural diagram of a convolution operational circuit provided in Example 9 of the disclosure.

FIG. 10 shows the DAC-based convolution operational circuit according to an embodiment of the disclosure. In this embodiment, a DAC-based convolution operational circuit 11 includes 13 MOS transistors (111, 112, 113, 114, 115, 116, 117, 118, 119, 1110, 1111, 1112, and 1113), three capacitors (1114, 1115, and 1116), and two inverting logic circuits (1117 and 1118). The MOS transistors 119, 1110, and 1111 are respectively the first to third MOS transistors, the MOS transistors 111, 112, 113, 114, 115, 116, 117, and 118 are respectively the fourth to eleventh MOS transistors, and the MOS transistors 1112 and 1113 are the MOS transistor A and the MOS transistor B respectively. Specifically, the source of the MOS transistor 111, the source of the MOS transistor 112, the source of the MOS transistor 115, the source of the MOS transistor 116, and the drain of the MOS transistor 119 are connected; the drain of the MOS transistor 111, the source of the MOS transistor 113, the drain of the MOS transistor 115, and the source of the MOS transistor 117 are connected; the drain of the MOS transistor 112, the source of the MOS transistor 114, the drain of the MOS transistor 116, and the source of the MOS transistor 118 are connected; the drain of the MOS transistor 113, the drain of the MOS transistor 117, and the drain of the MOS transistor 1112 are connected to the upper plate of the first capacitor 1114, and the terminal is defined as the non-inverting output terminal VP of CICU; the drain of the MOS transistor 114, the drain of the MOS transistor 118, and the drain of the MOS transistor 1113 are connected to the upper plate of the second capacitor 1115, and the terminal is defined as the inverting output terminal VN of CICU; the source of the MOS transistor 119 is connected to the drain of the MOS transistor 1110; the source of the MOS transistor 1110 and the drain of the MOS transistor 1111 are connected to the upper plate of the third capacitor 1116; the source of the MOS transistor 1111 is connected to the lower plate of the third capacitor 1116 to connect with the power supply VDD; the source of the MOS transistor 1112 is connected to the lower plate of the first capacitor 1114 to the ground; the source of the MOS transistor 1113 is connected to the lower plate of the third capacitor 1115 to the ground; the gate of the MOS transistor 114 and the gate of the MOS transistor 117 are connected to the input data signal $x_i$, and the high level and low level thereof correspond to the values 1 and −1; the gate of the MOS transistor 111 and the gate of the MOS transistor 112 are connected to the input weight signal $w_i$, and the high level and low level thereof correspond to the values 1 and −1; the gates of the MOS transistor 113 and the MOS transistor 118 are connected to the output terminal of the first inverter 1117; the gate of the MOS transistor 115 and the gate of the MOS transistor 116 are connected to the output terminal of the second inverter 1118; the input terminal of the first inverter 1117 is connected to the input data signal $x_i$; and the input terminal of the second inverter 1118 is connected to the input weight signal $w_i$. The gate of the MOS transistor 119 is connected to the clear signal CLR, the gate of the MOS transistor 1110 is connected to the bias voltage VBIAS, the gate of the MOS transistor 1111 is connected to the precharge signal CHARGE, and the gate of the MOS transistor 1112 and the gate of the MOS transistor 1113 are connected to the reset signal RESET.

The working principle of the CICU 11 circuit is explained in detail. As shown in FIG. 10, when the RESET signal is high level, the CLR signal is high level, and the CHARGE signal is high level, the MOS transistor 1112 and the MOS transistor 1113 are turned on to the ground, the positive and inverting output terminals of CICU 11 are reset to low level, the gate of the MOS transistor 119 is high level, the MOS transistor 119 is turned off, and the circuit of CICU 11 stops working. When the RESET signal is low level, the MOS transistor 1112 and the MOS transistor 1113 are turned off, and the CICU 11 circuit is in the working state. At this time, when the CHARGE signal is low level and the CLR signal is high level, CICU 11 works in the precharge state, the MOS transistor 119 is turned off, the MOS transistor 1111 is turned on, and the upper plate of the third capacitor 1116 is charged to the VDD level.

When the CHARGE signal is high level and the CLR signal is low level, the MOS transistor 119 is turned on, and the MOS transistor 1111 is turned off. At this time, the inverter circuit 1117 and the second inverter 1118 output inverting signals according to the values of the input data and the input weight. As an example, the signal $x_i$ corresponding to the input data and the signal $w_i$ corresponding to the input weight are of the same level. When $x_i$ and $w_i$ are both low levels, the gate of the MOS transistor 111 and the gate of the MOS transistor 117 are both low levels, and the MOS transistor 111, and the MOS transistor 117 are turned on. At this time, the charge on the upper plate of the third capacitor 1116 is discharged to the upper plate of the first capacitor 1114 through the channel formed by the MOS transistor 1110, the MOS transistor 119, the MOS transistor 111, and the MOS transistor 117. When $x_i$ and $w_i$ are both high level, the output terminal of the first inverter 1117 and the output terminal of the second inverter 1118 are low level, the gate of the MOS transistor 115 and the gate of the MOS transistor 113 are low level, and the MOS transistor 115 and the MOS transistor 113 are turned on. At this time, the charge on the upper plate of the third capacitor 1116 is discharged to the upper plate of the first capacitor 1114 through the channel formed by the MOS transistor 1110, the MOS transistor 119, the MOS transistor 115, and the MOS transistor 113. By setting the bias voltage value, the conduction degree of the MOS transistor 1110 may be adjusted, the value of the discharge current of the third capacitor 116 may be controlled, and thereby a voltage $\Delta V$ of a fixed amount is established at the non-inverting output terminal of the CICU 11 circuit within a unit time. In the same way, when the input data $x_i$ and the weight value $w_i$ are not of the same level, the inverting output terminal of the CICU 11 circuit establishes a voltage $\Delta V$ of a fixed amount. Thereafter, taking N circuit working cycles as an example, according to the numerical product of the input data and the weight, a value of 1 corresponds to a high-level signal, and a value of −1 corresponds to a low-level signal. If the numerical product of the input data and the weight is 1, that is, the levels of the data signal $x_i$ and the weight signal $w_i$ are the same, then the $\Delta V$ voltage is superimposed to the non-inverting output terminal of the CICU 11 circuit; and if the numerical product of the input data and the weight is −1, that is, the levels of the data signal $x_i$ and the weight signal $w_i$ are opposite, then the voltage $\Delta V$ is superimposed to the inverting output terminal of the CICU 11 circuit. After N circuit working cycles, assuming that the quantity of cycles in which the product of data and weight is 1 is q, then the output voltage of the positive terminal of the CICU circuit is: $V_P = q\Delta V$; the output voltage of the inverting terminal of the CICU 11 circuit is: $V_N = (N-q)\Delta V$; the differential output voltage of the CICU 11 circuit is:

$$V_P - V_N = \sum_{i=1}^{N} w_i x_i \Delta V;$$

and the differential voltage value corresponds to the multiply-accumulate operation result of the input data $x = [x_i, x_2, \ldots, x_N]$ and the weight $w = [w_i, w_2, \ldots, w_N]$.

It should be noted that in addition to adjusting the amount of the preset bias voltage, the value of the voltage $\Delta V$ may also be adjusted by adjusting the pulse width of the CLR signal and/or CHARGE signal. In addition, the voltage may also be adjusted by adjusting the amount of capacitance of the first capacitor and/or the second capacitor.

In the third aspect, the disclosure provides a DAC-based switched capacitor operational circuit (denoted as CISC-OC circuit), which includes M charge injection computing units, M first connection capacitors, and M second connection capacitors. The charge injection computing unit is the logic operational circuit provided by the first aspect of the disclosure or the DAC-based convolution operational circuit (CICU circuit) provided by the second aspect of the disclosure. The relevant technical solutions are the same as the first and second aspects, so details will not be repeated here.

When the charge injection computing unit is the DAC-based convolution operational circuit provided by the second aspect of the disclosure, related description is as follows.

Each of the non-inverting output terminals VP of the M charge injection computing units is connected to a terminal of the M first connection capacitors in a one-to-one mapping. The other terminals of the M first connection capacitors are connected together and serve as a non-inverting output terminal VOUTP of the switched capacitor operational circuit.

Each of the inverting output terminal VN of the M charge injection computing units is connected to a terminal of the M second connection capacitor in a one-to-one mapping. The other terminals of the M second connection capacitor are connected together and serve as an inverting output terminal VOUTN of the switched capacitor operational circuit.

The outputs of the non-inverting output terminals VP of the M charge injection computing units are superimposed at the non-inverting output terminal VOUTP through the corresponding first connection capacitors.

The outputs of inverting output terminals VN of the M charge injection computing units are superimposed at the inverting output terminal VOUTN through the corresponding second connection capacitor.

A convolution operation is divided into M groups of sub-convolution operations. A charge injection computing unit is used to implement a sub-convolution operation. A final voltage difference between the non-inverting output terminal VOUTP and the inverting output terminal VOUTN is the voltage value corresponding to the convolution operation result desired.

Preferably, the DAC-based switched capacitor operational circuit further includes a reset circuit respectively connected to the non-inverting output terminal VOUTP and the inverting output terminal VOUTN.

In an optional implementation, when performing the convolution operation of the input data and weights, the CISC-OC circuit includes K groups of CICU circuits, two groups of unit weight capacitor arrays, and two groups of common mode reset circuits. The multiply-accumulate operation is performed on N groups of input data and weight, each of the K groups of CICU circuit are time-division multiplexed for M times. According to the product result of the input data and weights, through successive charge injections, a voltage value related to a multiply-accumulate result of the input data and weights is established on the lower plate of the unit weight capacitor array. After the charge redistribution process on the plate of the unit weight capacitor array, an analog voltage value corresponding to the multiply-accumulate result of the N groups of input data and weights may be established at the differential output terminal.

It should be noted that the CISC-OC circuit is suitable for scenarios when the length N of the data to be convolved is large. By dividing the convolution operation of the data to be convolved into multiple groups of sub-convolution operations, the efficiency of the operation can be improved.

Figure 11:
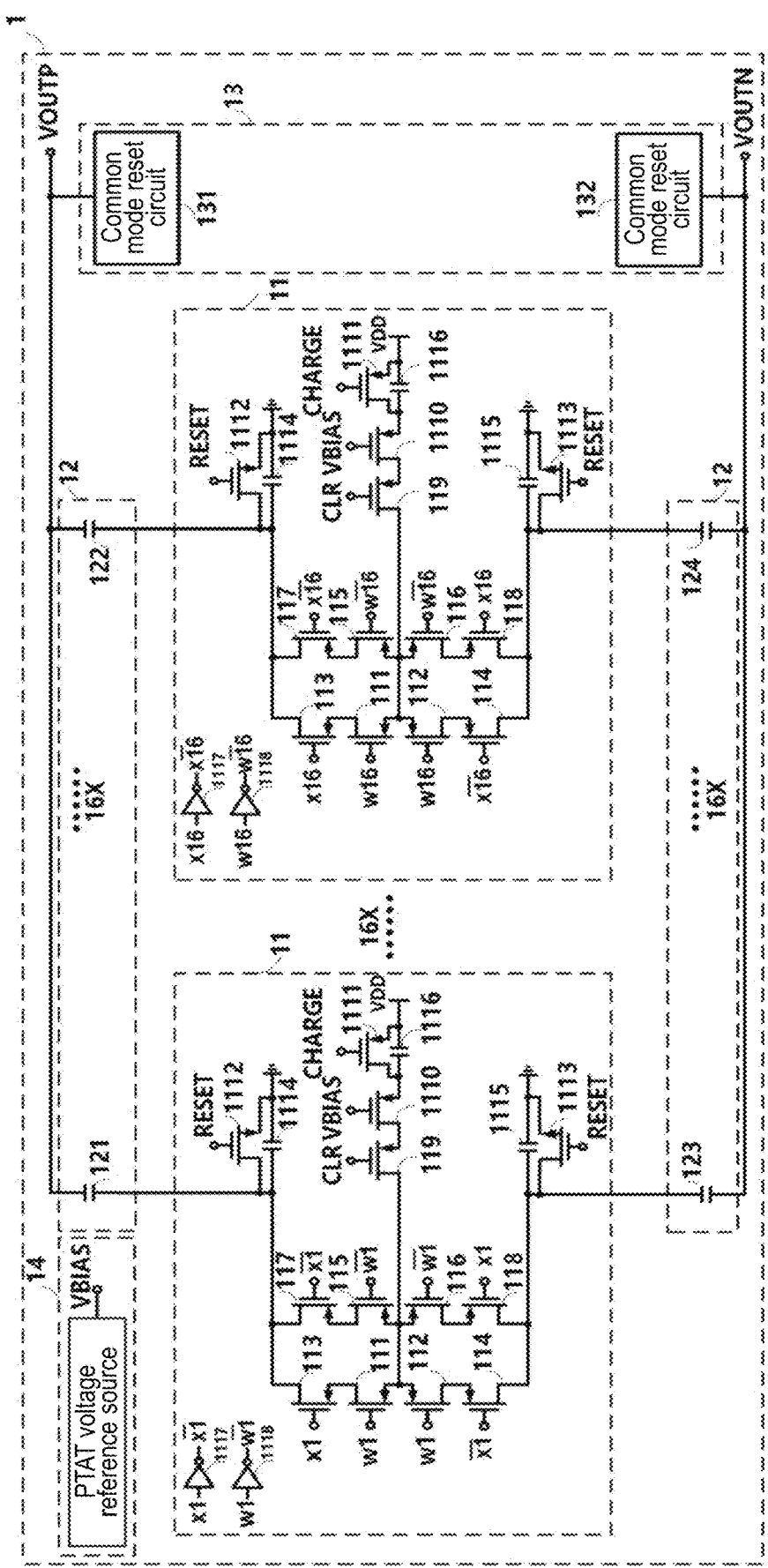
FIG. 11 is a schematic structural diagram of a switched capacitor operational circuit CISC-OC provided in the third aspect of the disclosure.

Specifically, FIG. 11 shows the first specific implementation of the CISC-OC circuit according to the disclosure. In this embodiment, a CISC-OC 1 circuit includes sixteen groups of CICU 11, two groups of unit weight capacitor arrays 12, two groups of common mode reset circuits 13, and a PTAT voltage reference source circuit 14. Each group of unit weight capacitor arrays 12 comprises sixteen capacitors with the same capacitance value. The upper plates of the first group of unit weight capacitor arrays are connected, and the terminal is defined as the non-inverting output terminal VOUTP of CISC-OC; the lower plates of the sixteen capacitors of the first group of unit weight capacitor arrays are respectively connected to the non-inverting output terminals of the sixteen groups of CICU 11; the upper plates of the second unit weight capacitor array are connected, and the terminal is defined as the inverting output terminal VOUTN of CISC-OC; the lower plates of the sixteen capacitors of the second group of unit weight capacitor arrays are respectively connected to the inverting output terminals of the sixteen groups of CICU 11. The first group of the common mode reset circuits 131 is connected to the non-inverting output terminal VOUTP of the CISC-OC 1 circuit; the second group of common mode reset circuits 132 is connected to the inverting output terminal VOUTN of the CISC-OC 1 circuit; and the PTAT voltage reference source 14 is connected to the VBIAS terminals of the sixteen groups of CICU 11 circuits.

Figure 12:
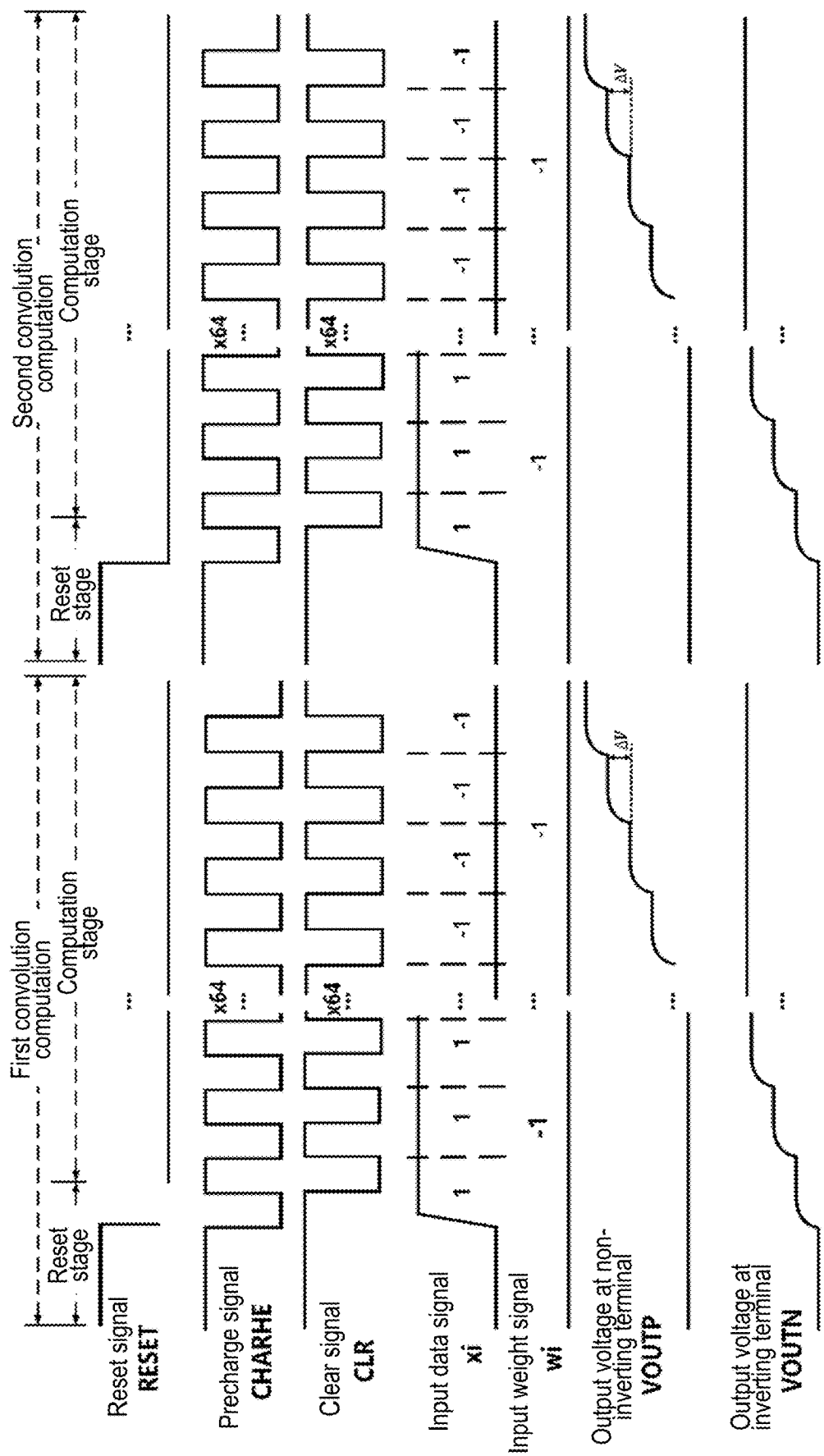
FIG. 12 is a working timing diagram of the switched capacitor operational circuit CISC-OC provided in the third aspect of the disclosure.

FIG. 12 shows the working timing diagram of the CISC-OC 1 circuit, and the working process thereof includes a reset stage and an operation stage. The working principle of the CISC-OC 1 circuit is explained in detail below.

First, the reset stage is as follows. When the common mode reset circuit 13 is turned on, the RESET signal is high level, the CHARGE signal is high level, and the CLR signal is high level, the CICU 11 circuit stops working, the positive and inverting output terminals are reset to low voltage, and the positive and inverting output terminals of the CISC-OC 1 circuit are reset to the common mode voltage.

Then, the operation stage is as follows. In the operation stage, it is necessary to calculate the multiply-accumulate operation result of the input data and weights. When the common mode reset circuit 13 stops working, taking the 64 working cycles of the CLR signal and the CHARGE signal as an example, each CICU 11 circuit sequentially inputs 64 groups of data signals and weight signals. Specifically, the ith group of data signals and weight signals input by the nth CICU 11 circuit are $x_{n,i}$ and $w_{n,i}$ respectively, in which n=1~16, i=1~64, the high level and low level of the signals correspond to the values 1 and −1. If the level directions of the data signal and the weight signal are the same, that is, the corresponding product of the data and the weight is 1, then the voltage $\Delta V$ is superimposed to the non-inverting output terminal of the CICU 11 circuit; and if the level directions of the data signal and the weight signal are opposite, that is, the corresponding product of the data and weight signal is −1, then the voltage $\Delta V$ is superimposed to the inverting output terminal of the CICU 11 circuit. Specifically, assuming that for the first group of CICU 11 circuits, the quantity of cycles in which the product of data and weight is 1 is q, then the output voltage of the positive terminal of the CICU 11 circuit is: $V_P = q\Delta V$; the output voltage of the inverting terminal of the CICU 11 circuit is: $V_N = (64-q)\Delta V$; the differential output voltage of the CICU 11 circuit is:

$$V_P - V_N = \sum_{i=1}^{64} w_{1,i} x_{1,i} \Delta V,$$

and the differential voltage value corresponds to the multiply-accumulate operation result of the input data and the weight. Afterward, the upper plate of the unit capacitor array goes through the charge redistribution process, and a voltage difference value of $$VOUTP - VOUTN = \sum_{i=1}^{64} w_{1,i} x_{1,i} \Delta V / 16$$

is established. Similarly, for the 16 groups of CICU 11 circuits, within 64 working cycles, a voltage difference value of $$VOUTP - VOUTN = \sum_{n=1}^{16} \sum_{i=1}^{64} w_{n,i} x_{n,i} \Delta V / 16$$

is established on the plate of the unit capacitor array. That is, the CISC-OC 1 circuit establishes an analog voltage value related to the multiply-accumulate sum of 1024 groups of input data and weights on the plate of the unit capacitor array within 64 working cycles. Considering that within a certain period, under a fixed value bias VBIAS voltage, the discharge amount of the CICU 11 circuit has a positive correlation with the temperature, the CISC-OC 1 circuit is designed to have a voltage reference source 14 with a positive temperature coefficient for compensation to ensure the high temperature robustness of ΔV during each discharge process.

When the charge injection computing unit is the logic operational circuit provided by the first aspect of the disclosure, related description is as follows.

Each of the output terminals VO of the M charge injection computing units is connected to a terminal of the M connection capacitors in a one-to-one mapping. The other terminals of the M connection capacitors are connected together and serve as an output terminal VOUT of the switched capacitor operational circuit.

The outputs of the output terminals VO of the M charge injection computing units are superimposed at the output terminal VOUT through the corresponding connection capacitor.

A logical operation is divided into M groups of sub-logical operations. A charge injection computing unit is used to implement a sub-logical operation. The output terminal VOUT is the voltage value corresponding to the logical operation result desired.

Preferably, in an optional implementation, the switched capacitor operational circuit further includes a reset circuit connected to the output terminal VOUT.

In the fourth aspect, the disclosure provides an electronic chip, which includes the logic operational circuit provided by the first aspect of the disclosure, the convolution operational circuit provided by the second aspect of the disclosure, or the switched capacitor operational circuit provided by the third aspect of the disclosure. The relevant technical solutions are the same as the first and second aspects, so details will not be repeated here.

In summary, the disclosure discloses a mixed-signal operational circuit based on a DAC array. For the operational circuit part, the first capacitor is used to determine the output terminal of the logic operational circuit, and the second capacitor is used to provide a certain voltage. The operational channel selects the charge channel from the second capacitor to the first capacitor based on data signal of each input, so as to superimpose the voltage value to the output terminal. Time-division multiplexing is achieved through successive injection, thereby an analog voltage value related to the logical operation result is established at the output terminal. The logical operation is realized by using only two capacitors, and there is no need to build a unit weight capacitor array equal to the quantity of logical operations, which reduces the capacitor area overhead significantly, thereby the area overhead of the operational circuit is reduced and the energy efficiency of the operation is improved while ensuring the working speed and precision.

It should be understood for persons skilled in the art that the above descriptions are only preferred embodiments of the disclosure and the embodiments, and are not intended to limit the disclosure. Any changes, for example, modifications, equivalent substitutions, and improvements made within the spirit and principles of the disclosure, should all be included in the protection scope of the disclosure.

What is claimed is:

1. A mixed-signal logic operational circuit, comprising:
a first MOS transistor, a second MOS transistor, a third MOS transistor, a first capacitor, a second capacitor, a logic operational channel, and a control unit, wherein
a terminal of the first capacitor serves as an output terminal VO of the logic operational circuit, and the other terminal of the first capacitor is connected to ground; a source of the first MOS transistor is connected to a drain of the second MOS transistor; a source of the second MOS transistor, a drain of the third MOS transistor, and a terminal of the second capacitor are connected; and a source of the third MOS transistor is connected to the other terminal of the second capacitor to connect with a power supply voltage VDD;
the control unit is configured to input data to be logically operated into the logic operational channel in response to performing a logical operation; before each input, the first MOS transistor is controlled to be turned off and the third MOS transistor is turned on to charge the second capacitor to the voltage VDD, and then the first MOS transistor is controlled to be turned on and the third MOS transistor is turned off; and
the logic operational channel is configured to control a connection state between a drain terminal of the first MOS transistor and the output terminal VO based on a level state of the input data.

2. The mixed-signal logic operational circuit according to claim 1, wherein
in response to the logical operation implemented by the mixed-signal logic operational circuit being an AND summing operation:
the data to be logically operated comprises data signals $x_i$ and weight signals $w_i$, i=1,2, . . . , N, and N is a total quantity of the data signals or the weight signals;
the control unit feds a pair of data and weight signal, $\{x_i, w_i\}$ into the logic operational channel at each time i;
the logic operational channel is configured to connect the drain terminal of the first MOS transistor to the output terminal VO after receiving the inputs of $x_i$ and $w_i$ when $x_i$ and $w_i$ are both high level to perform voltage superposition on the output terminal VO, and not connect the drain terminal of the first MOS transistor to the output terminal VO when $x_i$ and $w_i$ are not both high level to no longer perform voltage superposition on the output terminal VO; a gate of the second MOS transistor is connected with a bias voltage to ensure that the voltage superimposed each time is of same amount; and a final voltage value of the output terminal VO is a voltage value corresponding to an AND summing operation result $$\sum_{i=1}^{N} w_i \& x_i;$$

or in response to the logical operation implemented by the mixed-signal logic operational circuit being an OR summing operation:
the data to be logically operated comprises the data signals $x_i$ and the weight signals $w_i$, i=1,2, . . . , N, and N is the total quantity of the data signals or the weight signals;

the control unit feds a pair of data and weight signal, {$x_i$, $w_i$} into the logic operational channel at each time i;

the logic operational channel is configured to connect the drain terminal of the first MOS transistor to the output terminal VO after receiving the inputs of $x_i$ and $w_i$ when one of $x_i$ and $w_i$ is high level to perform voltage superposition on the output terminal VO, and not connect the drain terminal of the first MOS transistor to the output terminal VO when both $x_i$ and $w_i$ are not high level to no longer perform voltage superposition on the output terminal VO; the gate of the second MOS transistor is connected with the bias voltage to ensure that the voltage superimposed each time is of the same amount; and the final voltage value of the output terminal VO is a voltage value corresponding to an OR summing operation result $$\sum_{i=1}^{N} w_i | x_i;$$

or in response to the logical operation implemented by the mixed-signal logic operational circuit being a NOT summing operation:

the data to be logically operated comprises the data signals $x_i$, i=1,2, ..., N, and N is the total quantity of the data signals;

the control unit feds a pair of data and weight signal, {$x_i$, $w_i$} into the logic operational channel at each time i;

the logic operational channel is configured to connect the drain terminal of the first MOS transistor to the output terminal VO after receiving the inputs of $x_i$ when $x_i$ is low level to perform voltage superposition on the output terminal VO, and not connect the drain terminal of the first MOS transistor to the output terminal VO when $x_i$ is high level to no longer perform voltage superposition on the output terminal VO; the gate of the second MOS transistor is connected with the bias voltage to ensure that the voltage superimposed each time is of the same amount; and the final voltage value of the output terminal VO is a voltage value corresponding to an NOT summing operation result $$\sum_{i=1}^{N} \overline{x_{l_i}};$$

or in response to the logical operation implemented by the mixed-signal logic operational circuit being a NAND summing operation:

the data to be logically operated comprises the data signals $x_i$ and the weight signals $w_i$, i=1,2, ..., N, and N is the total quantity of the data signals or the weight signals;

the control unit feds a pair of data and weight signal, {$x_i$, $w_i$} into the logic operational channel at each time i;

the logic operational channel is configured to connect the drain terminal of the first MOS transistor to the output terminal VO after receiving the inputs of $x_i$ and $w_i$ when one of $x_i$ and $w_i$ is low level to perform a voltage superposition on the output terminal VO, and not connect the drain terminal of the first MOS transistor to the output terminal VO when both $x_i$ and $w_i$ are not low level to no longer perform voltage superposition on the output terminal VO; the gate of the second MOS transistor is connected with the bias voltage to ensure that the voltage superimposed each time is of the same amount; and the final voltage value of the output terminal VO is a voltage value corresponding to an NAND summing operation result $$\sum_{i=1}^{N} \overline{w_i \& x_i};$$

or in response to the logical operation implemented by the mixed-signal logic operational circuit being a NOR summing operation:

the data to be logically operated comprises the data signals $x_i$ and the weight signals $w_i$, i=1,2, ..., N, and N is the total quantity of the data signals or the weight signals;

the control unit feds a pair of data and weight signal, {$x_i$, $w_i$} into the logic operational channel at each time i;

the logic operational channel is configured to connect the drain terminal of the first MOS transistor to the output terminal VO after receiving the inputs of $x_i$ and $w_i$ when $x_i$ and $w_i$ are both low level to perform voltage superposition on the output terminal VO, and not connect the drain terminal of the first MOS transistor to the output terminal VO when $x_i$ and $w_i$ are not both low level to no longer perform voltage superposition on the output terminal VO; the gate of the second MOS transistor is connected with the bias voltage to ensure that the voltage superimposed each time is of the same amount; and the final voltage value of the output terminal VO is a voltage value corresponding to an NOR summing operation result $$\sum_{i=1}^{N} \overline{w_i | w_{t_i}};$$

or in response to the logical operation implemented by the mixed-signal logic operational circuit being an XNOR summing operation:

the data to be logically operated comprises the data signals $x_i$ and the weight signals $w_i$, i=1,2, ..., N, and N is the total quantity of the data signals or the weight signals;

the control unit feds a pair of data and weight signal, {$x_i$, $w_i$} into the logic operational channel at each time i;

the logic operational channel is configured to connect the drain terminal of the first MOS transistor to the output terminal VO after receiving the inputs of $x_i$ and $w_i$ when $x_i$ and $w_i$ are of same level to perform voltage superposition on the output terminal VO, and not connect the drain terminal of the first MOS transistor to the output terminal VO when $x_i$ and $w_i$ are not of the same level to no longer perform voltage superposition on the output terminal VO; the gate of the second MOS transistor is connected with the bias voltage to ensure that the voltage superimposed each time is of the same amount; and the final voltage value of the output terminal VO is a voltage value corresponding to an XNOR summing operation result $$\sum_{i=1}^{N} w_i \odot x_i;$$

or in response to the logical operation implemented by the mixed-signal logic operational circuit being an XOR summing operation:
   the data to be logically operated comprises the data signals $x_i$ and the weight signals $w_i$, i=1,2, ..., N, and N is the total quantity of the data signals or the weight signals;
   the control unit feds a pair of data and weight signal, $\{x_i, w_i\}$ into the logic operational channel at each time i;
and
   the logic operational channel is configured to connect the drain terminal of the first MOS transistor to the output terminal VO after receiving the inputs of $x_i$ and $w_i$ when $x_i$ and $w_i$ are not of the same level to perform voltage superposition on the output terminal VO, and not connect the drain terminal of the first MOS transistor to the output terminal VO when $x_i$ and $w_i$ are of the same level to no longer performed voltage superposition on the output terminal VO; the gate of the second MOS transistor is connected with the bias voltage to ensure that the voltage superimposed each time is of the same amount; the final voltage value of the output terminal VO is a voltage value corresponding to an XOR summing operation result $$\sum_{i=1}^{N} w_i \oplus x_i.$$

3. The mixed-signal logic operational circuit according to claim 2, wherein
   in response to the logical operation implemented by the mixed-signal logic operational circuit being the AND summing operation:
      the logic operational channel comprises a fourth MOS transistor and a fifth MOS transistor;
      a source of the fourth MOS transistor is connected to a drain of the fifth MOS transistor, and a drain of the fourth MOS transistor is connected to the output terminal VO;
      a source of the fifth MOS transistor is connected to the drain of the first MOS transistor;
      if the fourth MOS transistor is a PMOS transistor, then a gate of the fourth MOS transistor is connected with an inverting signal of $x_i$;
      if the fourth MOS transistor is an NMOS transistor, then the gate of the fourth MOS transistor is connected with $x_i$;
      if the fifth MOS transistor is a PMOS transistor, then a gate of the fifth MOS transistor is connected with an inverting signal of $w_i$; and
      if the fifth MOS transistor is an NMOS transistor, then the gate of the fifth MOS transistor is connected with $w_i$; or
   in response to the logical operation implemented by the mixed-signal logic operational circuit being an OR summing operation:
      the logic operational channel comprises the fourth MOS transistor and the fifth MOS transistor;
      the source of the fourth MOS transistor and the source of the fifth MOS transistor are jointly connected to the drain of the first MOS transistor;
      the drain of the fourth MOS transistor and the drain of the fifth MOS transistor are jointly connected to the output terminal VO;
      if the fourth MOS transistor is the PMOS transistor, then the gate of the fourth MOS transistor is connected with the inverting signal of $x_i$;
      if the fourth MOS transistor is the NMOS transistor, then the gate of the fourth MOS transistor is connected with $x_i$; if the fifth MOS transistor is the PMOS transistor, then the gate of the fifth MOS transistor is connected with the inverting signal of $w_i$; and
      if the fifth MOS transistor is the NMOS transistor, then the gate of the fifth MOS transistor is connected with $w_i$; or
   in response to the logical operation implemented by the mixed-signal logic operational circuit being a NOT summing operation:
      the logic operational channel comprises the fourth MOS transistor;
      the source of the fourth MOS transistor is connected to the drain of the first MOS transistor;
      the drain of the fourth MOS transistor is connected to the output terminal VO;
      if the fourth MOS transistor is the PMOS transistor, then the gate of the fourth MOS transistor is connected with $x_i$; and
      if the fourth MOS transistor is the NMOS transistor, then the gate of the fourth MOS transistor is connected with the inverting signal of $x_i$; or
   in response to the logical operation implemented by the mixed-signal logic operational circuit being the NAND summing operation:
      the logic operational channel comprises the fourth MOS transistor and the fifth MOS transistor;
      the source of the fourth MOS transistor and the source of the fifth MOS transistor are jointly connected to the drain of the first MOS transistor;
      the drain of the fourth MOS transistor and the drain of the fifth MOS transistor are jointly connected to the output terminal VO;
      if the fourth MOS transistor is the PMOS transistor, then the gate of the fourth MOS transistor is connected with $w_i$;
      if the fourth MOS transistor is the NMOS transistor, then the gate of the fourth MOS transistor is connected with the inverting signal of $w_i$;
      if the fifth MOS transistor is the PMOS transistor, then the gate of the fifth MOS transistor is connected with $x_i$; and
      if the fifth MOS transistor is the NMOS transistor, then the gate of the fifth MOS transistor is connected with the inverting signal of $x_i$; or
   in response to the logical operation implemented by the mixed-signal logic operational circuit being the NOR summing operation:
      the logic operational channel comprises the fourth MOS transistor and the fifth MOS transistor;

the source of the fourth MOS transistor is connected to the drain of the fifth MOS transistor;
the drain of the fourth MOS transistor is connected to the output terminal VO;
the source of the fifth MOS transistor is connected to the drain of the first MOS transistor;
if the fourth MOS transistor is the PMOS transistor, then the gate of the fourth MOS transistor is connected with $w_i$;
if the fourth MOS transistor is the NMOS transistor, then the gate of the fourth MOS transistor is connected with the inverting signal of $w_i$;
if the fifth MOS transistor is the PMOS transistor, then the gate of the fifth MOS transistor is connected with $x_i$; and
if the fifth MOS transistor is the NMOS transistor, then the gate of the fifth MOS transistor is connected with the inverting signal of $x_i$; or in response to the logical operation implemented by the mixed-signal logic operational circuit being the XNOR summing operation:
the logic operational channel comprises the fourth MOS transistor, the fifth MOS transistor, a sixth MOS transistor, and a seventh MOS transistor;
the source of the fourth MOS transistor is connected to the drain of the fifth MOS transistor;
a source of the sixth MOS transistor is connected to a drain of the seventh MOS transistor;
the drain of the fourth MOS transistor is connected to a drain of the sixth MOS transistor to connect with the output terminal VO;
the source of the fifth MOS transistor and a source of the seventh MOS transistor are connected to the drain of the first MOS transistor;
if the fourth MOS transistor is the PMOS transistor, then the gate of the fourth MOS transistor is connected with $x_i$;
if the fourth MOS transistor is the NMOS transistor, then the gate of the fourth MOS transistor is connected with the inverting signal of $x_i$;
if the fifth MOS transistor is the PMOS transistor, then the gate of the fifth MOS transistor is connected with $w_i$;
if the fifth MOS transistor is the NMOS transistor, then the gate of the fifth MOS transistor is connected with the inverting signal of $w_i$;
if the sixth MOS transistor is the PMOS transistor, then a gate of the sixth MOS transistor is connected with the inverting signal of $x_i$;
if the sixth MOS transistor is the NMOS transistor, then the gate of the sixth MOS transistor is connected with $x_i$;
if the seventh MOS transistor is the PMOS transistor, then a gate of the seventh MOS transistor is connected with the inverting signal of $w_i$; and
if the seventh MOS transistor is the NMOS transistor, then the gate of the seventh MOS transistor is connected with $w_i$; or in response to the logical operation implemented by the mixed-signal logic operational circuit being the XOR summing operation:
the logic operational channel comprises the fourth MOS transistor, the fifth MOS transistor, the sixth MOS transistor, and the seventh MOS transistor;
the source of the fourth MOS transistor is connected to the drain of the fifth MOS transistor;
the source of the sixth MOS transistor is connected to the drain of the seventh MOS transistor;
the drain of the fourth MOS transistor is connected to the drain of the sixth MOS transistor to connect with the output terminal VO;
the source of the fifth MOS transistor and the source of the seventh MOS transistor are connected to the drain of the first MOS transistor;
if the fourth MOS transistor is the PMOS transistor, then the gate of the fourth MOS transistor is connected with the inverting signal of $x_i$;
if the fourth MOS transistor is the NMOS transistor, then the gate of the fourth MOS transistor is connected with $x_i$;
if the fifth MOS transistor is the PMOS transistor, then the gate of the fifth MOS transistor is connected with $w_i$;
if the fifth MOS transistor is the NMOS transistor, then the gate of the fifth MOS transistor is connected with the inverting signal of $w_i$;
if the sixth MOS transistor is the PMOS transistor, then the gate of the sixth MOS transistor is connected with $x_i$;
if the sixth MOS transistor is the NMOS transistor, then the gate of the sixth MOS transistor is connected with the inverting signal of $x_i$;
if the seventh MOS transistor is the PMOS transistor, then the gate of the seventh MOS transistor is connected with the inverting signal of $w_i$, and
if the seventh MOS transistor is the NMOS transistor, then the gate of the seventh MOS transistor is connected with $w_i$.

4. The mixed-signal logic operational circuit according to claim 1, further comprising a MOS transistor C, wherein a drain of the MOS transistor C is connected to the output terminal VO, and a source of the MOS transistor C is connected to the ground; and
the control unit is further configured to reset the logic operational circuit before performing a convolution operation: the MOS transistor C is controlled to be turned on, and the first MOS transistor and the third MOS transistor are turned off, so as to reset the output terminal VO to the ground; and in response to performing the logical operation, the MOS transistor C is controlled to be turned off.

5. An electronic chip, comprising the mixed-signal logic operational circuit according to claim 1.

* * * * *